(12) United States Patent
Matsuzawa et al.

(10) Patent No.: US 8,362,934 B2
(45) Date of Patent: Jan. 29, 2013

(54) COMPARATOR AND ANALOG/DIGITAL CONVERTER

(75) Inventors: Akira Matsuzawa, Tokyo (JP); Masaya Miyahara, Tokyo (JP)

(73) Assignee: Tokyo Institute of Technology (JP)

( * ) Notice: Subject to any disclaimer, the term of this patent is extended or adjusted under 35 U.S.C. 154(b) by 5 days.

(21) Appl. No.: 13/127,141

(22) PCT Filed: Oct. 28, 2009

(86) PCT No.: PCT/JP2009/068514
§ 371 (c)(1),
(2), (4) Date: May 2, 2011

(87) PCT Pub. No.: WO2010/050515
PCT Pub. Date: May 6, 2010

(65) Prior Publication Data
US 2011/0215959 A1  Sep. 8, 2011

(30) Foreign Application Priority Data

Oct. 31, 2008 (JP) ................................ 2008-282387

(51) Int. Cl.
*H03M 1/06* (2006.01)

(52) U.S. Cl. .................... 341/118; 341/120; 341/155

(58) Field of Classification Search .................. 341/117, 341/118, 119, 120, 155
See application file for complete search history.

(56) References Cited

U.S. PATENT DOCUMENTS

| 4,370,367 | A | * | 1/1983 | Novinski et al. | 427/453 |
| 5,734,342 | A | * | 3/1998 | Mes | 341/159 |
| 6,084,538 | A | * | 7/2000 | Kostelnik et al. | 341/120 |
| 6,288,666 | B1 | * | 9/2001 | Afghahi et al. | 341/158 |
| 6,710,733 | B2 | * | 3/2004 | Gendai | 341/155 |

FOREIGN PATENT DOCUMENTS

| JP | 4-291090 A | 10/1992 |
| JP | 2002-237743 A | 8/2002 |

OTHER PUBLICATIONS

D. Schinkel et al., "A Double-Tail Latch-Type Voltage Sense Amplifier with 18ps Setup + Hold Time", IEEE, ISSCC 2007, Dig. of Tech. Paper, pp. 314-315, 605, Feb. 2007.
International Search Report for International Application No. PCT/JP2009/068514 mailed Nov. 24, 2009 with English translation.

* cited by examiner

*Primary Examiner* — Jean B Jeanglaude
(74) *Attorney, Agent, or Firm* — Cantor Colburn LLP

(57) ABSTRACT

To provide a comparator and an A/D converter having the comparator. The comparator includes a differential amplifier circuit section and a differential latch circuit section. A first input voltage signal, a second input voltage signal and a clock signal are inputted to the differential amplifier circuit section. The differential amplifier circuit section operates base on the clock signal to output a first output voltage signal and a second output voltage signal which respectively correspond to the value the input voltage signal and the value of the reference voltage signal and are amplified. The differential latch circuit section operates based on the first and second output voltage signals to keep and output a comparison result between the first input voltage signal and the second input voltage signal.

17 Claims, 14 Drawing Sheets

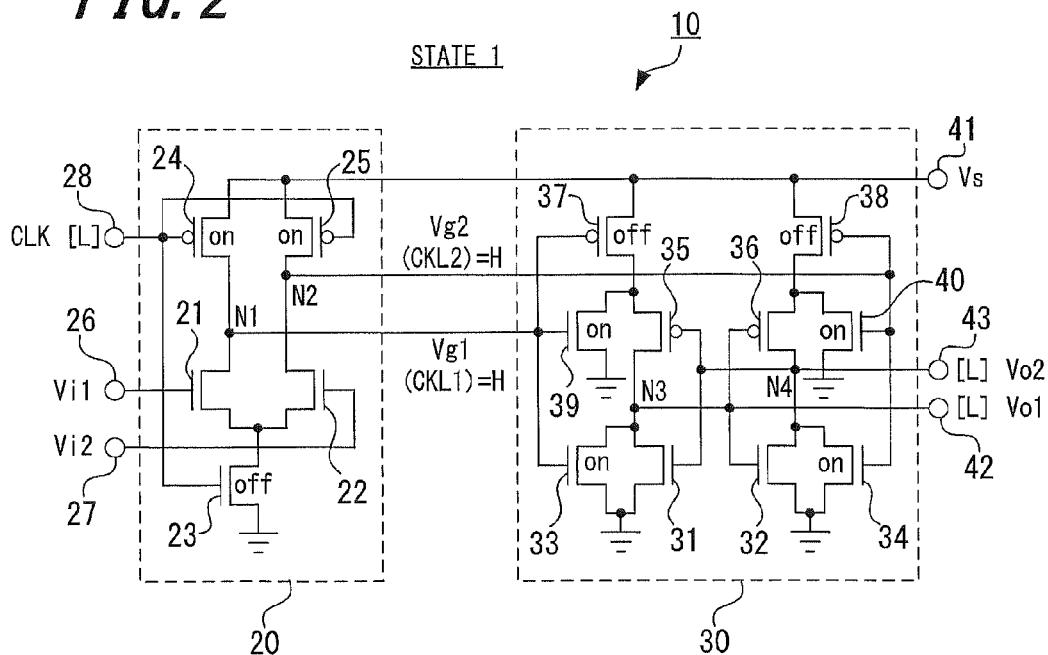
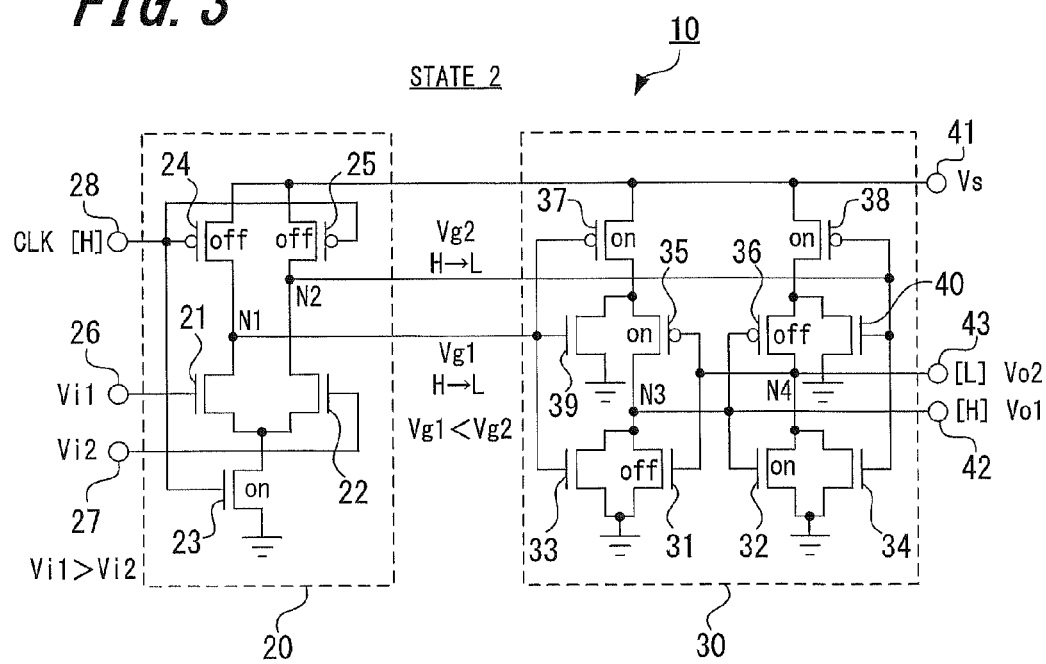

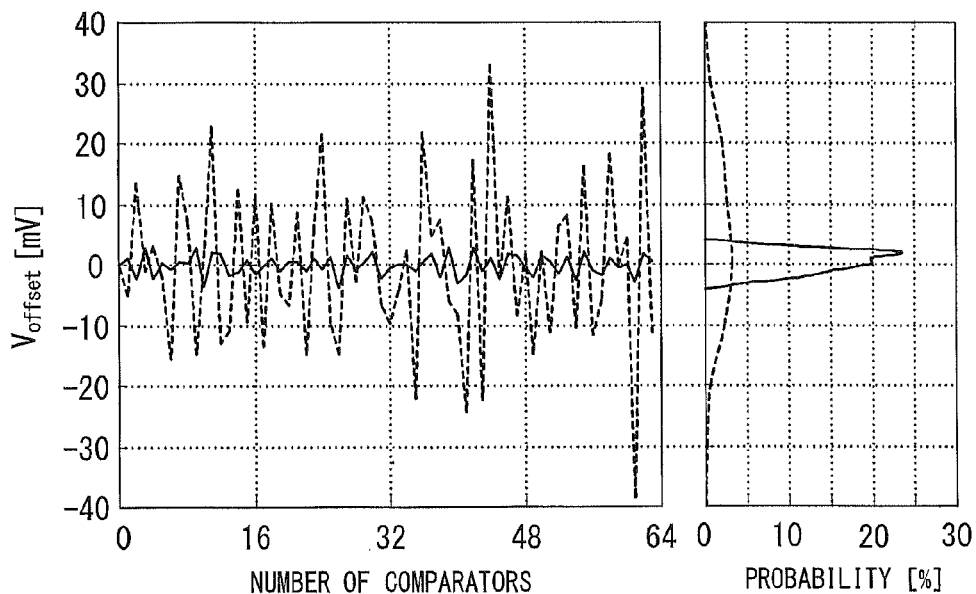
*FIG. 12A*  *FIG. 12B*
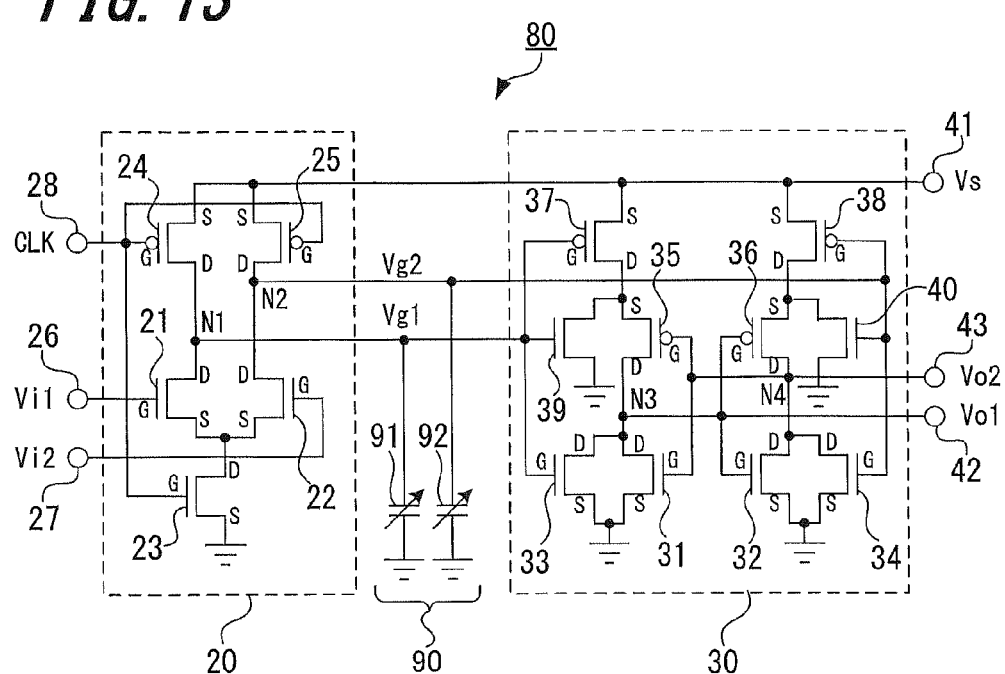
*FIG. 13*

US 8,362,934 B2

COMPARATOR AND ANALOG/DIGITAL CONVERTER

CROSS REFERENCE TO RELATED APPLICATIONS

This is a U.S. national stage application of International Application No. PCT/JP2009/068514, filed on Oct. 28, 2009. Priority under 35 U.S.C. 119(a) and 35 U.S.C. 365(b) is claimed from Japanese Application No. JP 2008-282387, filed Oct. 31, 2008, the disclosure of which is also incorporated herein by reference.

TECHNICAL FIELD

The present invention relates to a comparator and an A/D converter having the comparator. More particularly, the present invention relates to a comparator configured using a plurality of MOS transistors and an A/D converter having the comparator.

BACKGROUND ART

Conventionally, various comparators to be used for an A/D (analog to digital) converter or the like have been proposed (see, for example, Patent Document 1 and Non-patent Document 1). Here, a comparator having a configuration described in Non-patent Document 1 will be described below with reference to FIGS. 18, 19, 20A, 20B and 20C. FIG. 18 is a diagram showing a state of the comparator before operation (i.e., in a preparatory stage), and FIG. 19 is a diagram showing a state of the comparator during operation. Further, FIGS. 20A, 20B and 20C are graphs respectively showing temporal change of output voltages of the comparator, temporal change of output voltages in a differential preamplifier circuit section of the comparator, and temporal change of clock signals for controlling the operation of the comparator.

As shown in FIG. 18, a comparator 400 according to the prior art includes a dynamic differential preamplifier circuit section 200 arranged on an input side (a first stage), and a differential latch circuit section 300 arranged on an output side (a second stage). Incidentally, in FIG. 18, the symbols G, S and D respectively represent a gate terminal, a source terminal and a drain terminal of each MOS transistor.

The differential preamplifier circuit section 200 includes three NMOS (Negative channel Metal Oxide Semiconductor) transistors 201 to 203, and two PMOS (Positive channel Metal Oxide Semiconductor) transistors 204 and 205. Incidentally, a PMOS transistor is a MOS transistor that has a p-type channel (i.e., current path) polarity and that becomes ON state when a voltage signal of "L" state is inputted to the gate terminal thereof, so that current flows from the source terminal to the drain terminal thereof. While a NMOS transistor is a MOS transistor that has an n-type channel polarity and that becomes ON state when a voltage signal of "H" state is inputted to the gate terminal thereof, so that current flows from the drain terminal to the source terminal thereof.

The MOS transistors configuring the differential preamplifier circuit section 200 are connected with each other as shown in FIG. 18 so that each transistor performs predetermined operation. Further, the gate terminal of the NMOS transistor 201 and the gate terminal of the NMOS transistor 202 are connected to an input terminal 206 and an input terminal 207 respectively. The gate terminal of the NMOS transistor 203 and the gate terminals of the two PMOS transistors 204 and 205 are connected to a clock terminal 208 to which a clock signal CLK is inputted. Further, the source terminals of the PMOS transistor 204 and 205 are connected to a power supply terminal 310 of a power supply voltage $V_s$. In other words, the operation of the differential preamplifier circuit section 200 is controlled by the clock signal inputted to the gate terminals of the NMOS transistor 203, the PMOS transistor 204 and the PMOS transistor 205.

The differential latch circuit section 300 includes four NMOS transistors 301 to 304, and three PMOS transistors 305 to 307. These MOS transistors in the differential latch circuit section 300 are connected with each other as shown in FIG. 18 so that each transistor performs predetermined operation.

Further, the gate terminal of the PMOS transistor 307 in the differential latch circuit section 300 is connected to a clock terminal 311 to which a clock signal with opposite phase to the clock signal CLK inputted to the differential preamplifier circuit section 200 (i.e., to the clock terminal 208) is inputted. The operation of the PMOS transistor 307 is controlled by the clock signal with opposite phase. In other words, the operation of the latch circuit, which is configured by two NMOS transistors 301 and 302 and two PMOS transistors 305 and 306, is controlled by performing an on-off control on the PMOS transistor 307 by the clock signal with opposite phase. Further, the source terminals of the PMOS transistor 307 is connected to the power supply terminal 310 of the power supply voltage $V_s$.

Further, the gate terminals of the NMOS transistor 303 and the NMOS transistor 304 in the differential latch circuit section 300 are respectively connected to output terminals (nodes) N1 and N2 of the differential preamplifier circuit section 200. The NMOS transistors 303 and 304 are on-off controlled by the output signal from the differential preamplifier circuit section 200, so that the current flowing through the latch circuit is controlled. In other words, the operation of the differential latch circuit section 300 is controlled by the clock signal inputted to the gate terminal of the PMOS transistor 307 and the output voltage signals inputted from the differential preamplifier circuit section 200 to the NMOS transistors 303 and 304.

Next, the operation of the comparator 400 according to the prior art will be described below in more detail with reference to FIGS. 18, 19, 20A, 20B and 20C.

As shown in FIG. 18, in the preparatory stage (referred to as "state 1" hereinafter) of the operation, a clock voltage of "L (Low)" state and a clock voltage of "H (High)" state are respectively inputted to the clock terminals 208 and 311 of the comparator 400. In such a case, in the differential preamplifier circuit section 200, the two PMOS transistors 204 and 205 become ON state, and the NMOS transistor 203 becomes OFF state. At this time, since the NMOS transistor 203 is in OFF state, no through-current flows through the differential preamplifier circuit section 200; however, since the PMOS transistors 204 and 205 are in ON state, the voltage at the nodes N1 and N2 in the differential preamplifier circuit section 200 will increase due to the power supply voltage $V_s$. As a result, the voltages Vg1 and Vg2 respectively outputted from the nodes N1 and N2 in the differential preamplifier circuit section 200 will both become "H" state.

On the other hand, in state 1, since the clock voltage of "H" state is inputted to the gate terminal of the PMOS transistor 307 in the differential latch circuit section 300, the PMOS transistor 307 becomes OFF state. In such a case, no current flows from the side of the power supply voltage $V_s$ to the latch circuit, which is configured by two NMOS transistors 301 and 302 and two PMOS transistors 305 and 306. Further, in state 1, since the gate voltages (Vg1 and Vg2) of the NMOS transistors 303 and 304 in the differential latch circuit section 300 are in "H" state, the two transistors both become ON state. Thus, nodes N3 and N4 in the differential latch circuit section 300 become the same potential as the ground (i.e., become zero potential). As a result, voltages Vo1 and Vo2 outputted respectively from output terminals 312 and 313 of the comparator 400 both become "L" state.

Incidentally, in characteristics shown in FIGS. 20A to 20C, the characteristic before time t1 indicates the change of the output voltages Vo1 and Vo2 of the comparator 400, the change of the output voltages Vg1 and Vg2 of the differential preamplifier circuit section 200, and the change of the clock voltages inputted to the clock terminals 208 and 311 in state 1. However, in the characteristics shown in FIGS. 20A to 20C, the state "H" corresponds to 1 [V], and the "L" state corresponds to 0 [V].

Next, a state of the comparator 400 during operation (referred to as "state 2" hereinafter) will be described below with reference to FIG. 19. However, the example shown in FIG. 19 is based on a case where the voltage Vi1 inputted to one input terminal 206 of the comparator 400 is higher than the voltage Vi2 inputted to the other input terminal 207 of the comparator 400 (i.e., Vi1>Vi2).

In state 2, the clock voltage inputted to the clock terminal 208 changes to "H" state. Thus, in the differential preamplifier circuit section 200, the two PMOS transistors 204 and 205 become OFF state, and the NMOS transistor 203 becomes ON state. Since the voltage values of the nodes N1 and N2 in the differential preamplifier circuit section 200 was in "H" state in state 1 (i.e., the preparatory stage), when the NMOS transistor 203 becomes ON state in state 2, current will flow to the ground through the NMOS transistors 201 to 203. Thus, the voltage values of the nodes N1 and N2 will decrease with elapse of time and transit to "L" state.

However, at this time, currents corresponding to the input voltages Vi1 and Vi2 applied to the gate terminals of the NMOS transistors 201 and 202 will flow through the NMOS transistors 201 and 202. In the example shown in FIG. 19, since Vi1>Vi2, the current flowing through the NMOS transistor 201 is larger than the current flowing through the NMOS transistor 202. As a result, the voltage drop rate of the output voltage Vg1 at the node N1 with respect to the time is larger than the voltage drop rate of the output voltage Vg2 at the node N2 with respect to the time.

Such circumstance is shown in FIG. 20B. After the state of the comparator 400 is switched to state 2 (i.e., after time t1), the output voltage Vg1 at the node N1 transits to "L" state more early than the output voltage Vg2 at the node N2. Thus, during the period between the time when the state of the comparator is switched to state 2 and the time when the output voltage Vg2 at the node N2 transits to the "L" state, the output voltage Vg2 at the node N2 is higher than the output voltage Vg1 at the node N1. In other words, during the transition period of the output voltage Vg2 at the node N2, the gate voltage of the NMOS transistor 304 is higher than the gate voltage of the NMOS transistor 303 in the differential latch circuit section 300.

Further, when the state of the comparator becomes state 2, the clock voltage inputted to the clock terminal 311 is changed to the "L" state, and the PMOS transistor 307 in the differential latch circuit section 300 becomes ON state. Thus, current begins to flow through the latch circuit, which is configured by two NMOS transistors 301 and 302 and two PMOS transistors 305 and 306. However, as described above, since the gate voltage of the NMOS transistor 304 is higher than the gate voltage of the NMOS transistor 303 during the transition period of the output voltage Vg2 at the node N2, the potential (Vo1) at the node N3 is slightly higher than the potential (Vo2) at the node N4.

Such circumstance is shown in FIG. 20A. After the comparator is switched to state 2 (i.e., after time t1), both the output voltage Vo1 (solid line) at the node N3 and the output voltage Vo2 (broken line) at the node N4 increase with elapse of time; however, the output voltage Vo1 begins to become higher than the output voltage Vo2 near time t2. Thus, positive feedback operates in the latch circuit, which is configured by two NMOS transistors 301 and 302 and two PMOS transistors 305 and 306 (the details of the positive feedback operation will be described later in the description of the best modes of the present invention). As a result, as shown in FIG. 20A, after time t2, the output voltage Vo1 at the node N3 continues to increase and is finally fixed in "H" state. On the other hand, the output voltage Vo2 at the node N4 continues to decrease and is finally fixed in "L" state. Thus, the comparison state (i.e., the comparison result) of the input voltages Vi1 and Vi2 is kept in the differential latch circuit section 300 and outputted from the output terminals 312 and 313.

Further, at this time, the PMOS transistor 305 of the latch circuit is in ON state, and the NMOS transistor 301 of the latch circuit is in OFF state (see FIG. 19), wherein the gate terminal of the PMOS transistor 305 and the gate terminal of the NMOS transistor 301 are connected to the node N4. On the other hand, the PMOS transistor 306 of the latch circuit is in OFF state, and the NMOS transistor 302 of the latch circuit is in ON state (see FIG. 19), wherein the gate terminal of both the PMOS transistor 306 and the gate terminal of the NMOS transistor 302 are connected to the node N3. Further, since the gate voltages (Vg1 and Vg2) applied to two NMOS transistors 303 and 304 are in state, the NMOS transistors 303 and 304 are in OFF state. Thus, no steady current (through-current) flows in the differential latch circuit section 300. The comparator 400 according to the prior art operates in the aforesaid manner.

PRIOR ART DOCUMENTS

Patent Documents

[Patent document 1] U.S. Pat. No. 6,084,538

Non-Patent Documents

[Non-patent documents] D. Schinkel, E. Mensink, E. Klumperink, E. Van Tuiji, B. Nauta: "A Double-Tail Latch-Type Voltage Sense Amplifier with 18 ps Setup+Hold Time", IEEE, ISSCC 2007, Dig. of Tech. Paper, pp. 314-315, February 2007

DISCLOSURE OF THE INVENTION

Problems to be Solved by the Invention

In the circuit configuration of the comparator according to the prior art, the operation of the differential preamplifier circuit section of the first stage and the operation of the differential latch circuit section of the second stage are respectively controlled by two clock signals with different polarities. Thus, power consumption of the clock circuit is large.

Further, in the comparator according to the prior art, when timing-skew between two clock signals with different polarities occurs, performance of the comparator will be largely affected. For example, in the comparator 400 shown in FIGS. 18 and 19, in the case where the rising timing of the clock signal inputted to the clock terminal 208 is earlier than the falling timing of the clock signal inputted to the clock terminal 311, the gate voltages of the NMOS transistors 303 and 304 in the differential latch circuit section 300 will become "L" state before the latch circuit, which is configured by two NMOS transistors 301 and 302 and two PMOS transistors 305 and 306, operates. In such a case, no potential difference will be generated between the node N3 and the node N4 even if the latch circuit operates, and therefore the comparison of the input voltage values will be difficult, so that the comparator 400 will malfunction.

In contrast, in the case where the rising timing of the clock signal inputted to the clock terminal 208 is later than the falling timing of the clock signal inputted to the clock terminal 311, the gate voltages of the NMOS transistors 303 and 304 will remain in "H" state even when the latch circuit operates. In such a case, the gate voltages of the NMOS transistors 303 and 304 will both in ON state, and a large through-current will flow through the latch circuit.

In order to make the comparator to operate normally without causing the aforesaid problems, it is necessary to very precisely match the rising/falling timing of the two clock signals with different polarities. As described above, the comparator according to the prior art is operated using difference of the two output voltages from the differential preamplifier circuit section generated immediately after the state is switched. As shown in FIG. 20A, the period td between the time when the state of the comparator is switched and the time when the difference of the two output voltages from the differential preamplifier circuit section begins to be generated is about 50 to 100 psec. Thus, to solve the aforesaid problems, the timing-skew between the two clock signals with different polarities needs to be controlled within a range of several psec. However, with such a method, it is necessary to precisely control the timing of the two clock signals with different polarities, and therefore the comparator is very difficult to use.

The present invention is made in view of the above problems, and it is an object of the present invention to provide a comparator capable of solving the problems caused by the timing-skew between the two clock signals with different polarities and capable of performing low-power operation, as well as an A/D converter having such a comparator.

Means for Solving the Problems

To solve the aforesaid problems, a comparator according to an aspect of the present invention includes a dynamic differential amplifier circuit section, to which a first input voltage signal, a second input voltage signal and a clock signal are inputted, adapted to operate, based on the clock signal, to output a first output voltage signal and a second output voltage signal and further, when the clock signal is in a first state, to cut off through-current and pre-charge the voltage values of the first and second output voltage signals to a predetermined voltage value; and, when the clock signal is in a second state, to change the voltage values of the first and second output voltage signals in the same direction at the same timing and generate a voltage difference between the voltage value of the first output voltage signal and the voltage value of the second output voltage signal without causing through-current to flow, wherein the first output voltage signal and the second output voltage signal respectively correspond to the value of the first input voltage signal and the value of the second input voltage signal and are amplified. The comparator of the present invention further includes a differential latch circuit section adapted to operate, based on the first output voltage signal and the second output voltage signal, to keep and output a comparison result between the first input voltage signal and the second input voltage signal, without requiring a clock signal.

In other words, in the present invention, the first and the second output voltage signals outputted from the differential amplifier circuit section are used to control the operation of the differential latch circuit section.

Further, an A/D converter according to another aspect of the present invention includes a plurality of comparators, to which an input voltage signal, a reference voltage signal to be compared with the input voltage signal, and a clock signal are inputted, adapted to output a comparison result between the input voltage signal and the reference voltage signal; and an encoder adapted to output a digital signal corresponding to the input voltage signal based on the comparison result outputted from the plurality of comparators.

Advantages of the Invention

According to the present invention, the operation of the dynamic differential amplifier circuit section is controlled by the clock signal, and the operation of the differential latch circuit section is controlled by the first and second output voltage signals outputted from the dynamic differential amplifier circuit section. Thus, the rising/falling timing of the signals (the first and second output voltage signals) for controlling the differential latch circuit section do not depend on the timing of the clock signal inputted to the dynamic differential amplifier circuit section. Thus, according to the present invention, the aforesaid problems caused by the timing-skew between two clock signals with different polarities can be solved.

Further, according to the present invention, since the clock signal to be inputted to the comparator is only the clock signal inputted to the dynamic differential amplifier circuit section, it is possible to drive the comparator and the A/D converter having the comparator with lower power than the prior art.

BRIEF DESCRIPTION OF DRAWINGS

FIG. 2 is a diagram showing a state of the comparator according to the first embodiment before operation;

FIG. 3 is a diagram showing a state of the comparator according to the first embodiment during operation;

FIG. 12A is a graph showing a distribution of an offset voltage of the comparator, and FIG. 12B is a graph showing a statistical distribution of the offset voltage;

FIG. 13 is a diagram showing a schematic circuit configuration of a comparator according to a third embodiment of the present invention;

BEST MODES FOR CARRYING OUT THE INVENTION

Figure 1:
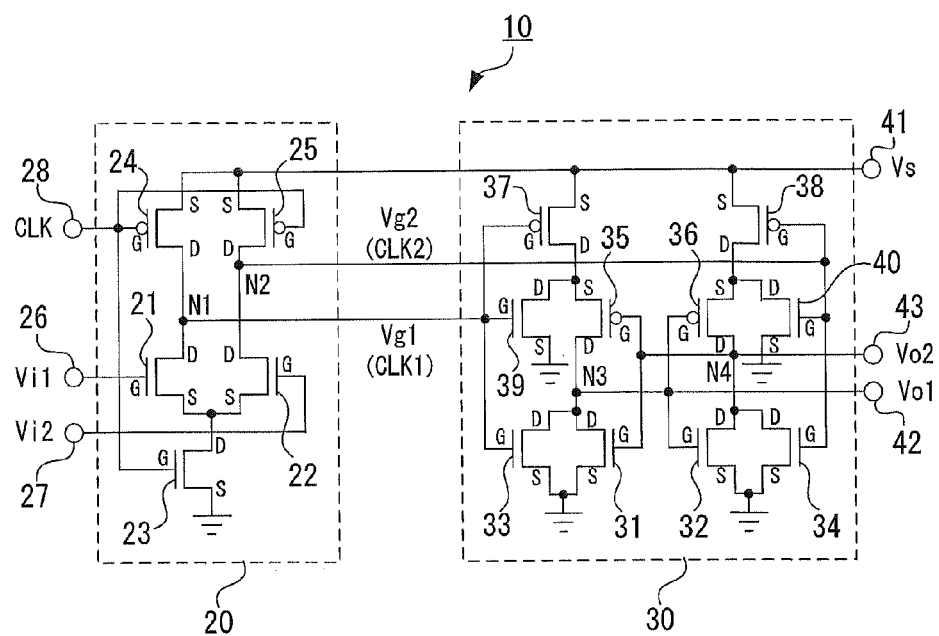
FIG. 1 is a diagram showing a schematic circuit configuration of a comparator according to a first embodiment of the present invention.

Examples of the comparator and A/D converter according to embodiments of the present invention will be described below with reference to the attached drawings; however, the present invention is not limited to these examples.
1. First embodiment: basic configuration examples
2. Second embodiment: first configuration example having offset voltage compensating circuit section
3. Third embodiment: second configuration example having offset voltage compensating circuit section
4. Fourth embodiment: configuration example having interpolation function 1. First Embodiment Configuration of Comparator FIG. 1 shows a circuit configuration of a comparator 10 according to a first embodiment of the present invention. The comparator 10 mainly includes a dynamic differential preamplifier circuit section 20 arranged on an input side (a first stage), and a differential latch circuit section 30 arranged on an output side (a second stage). Incidentally, in FIG. 1, the symbols G, S and D respectively represent a gate terminal, a source terminal and a drain terminal of each transistor.

Figure 18:
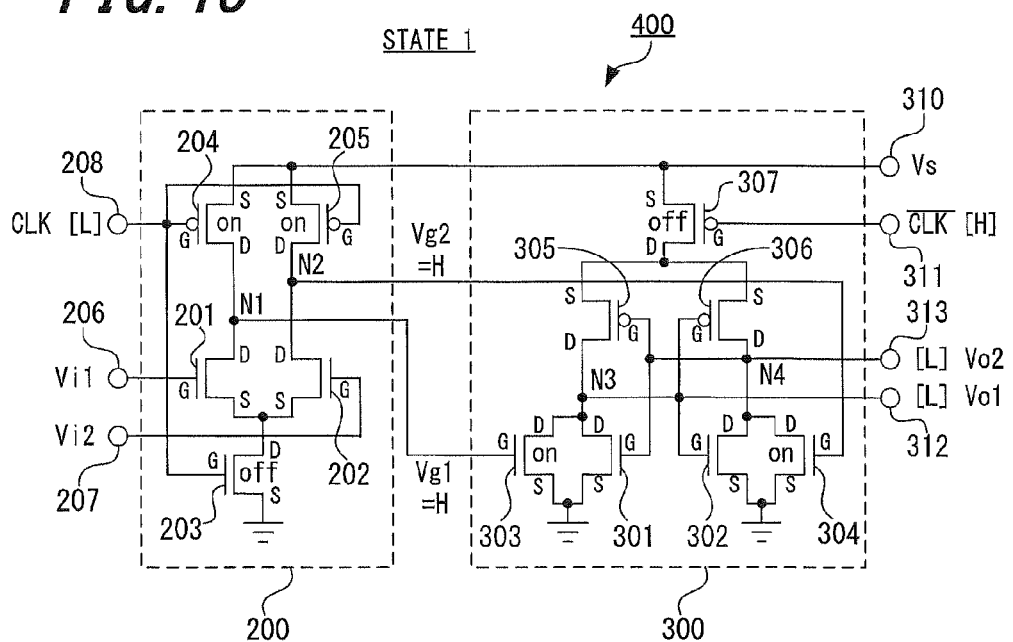
FIG. 18 is a diagram showing a state of a comparator according to a prior art before operation.
Figure 19:
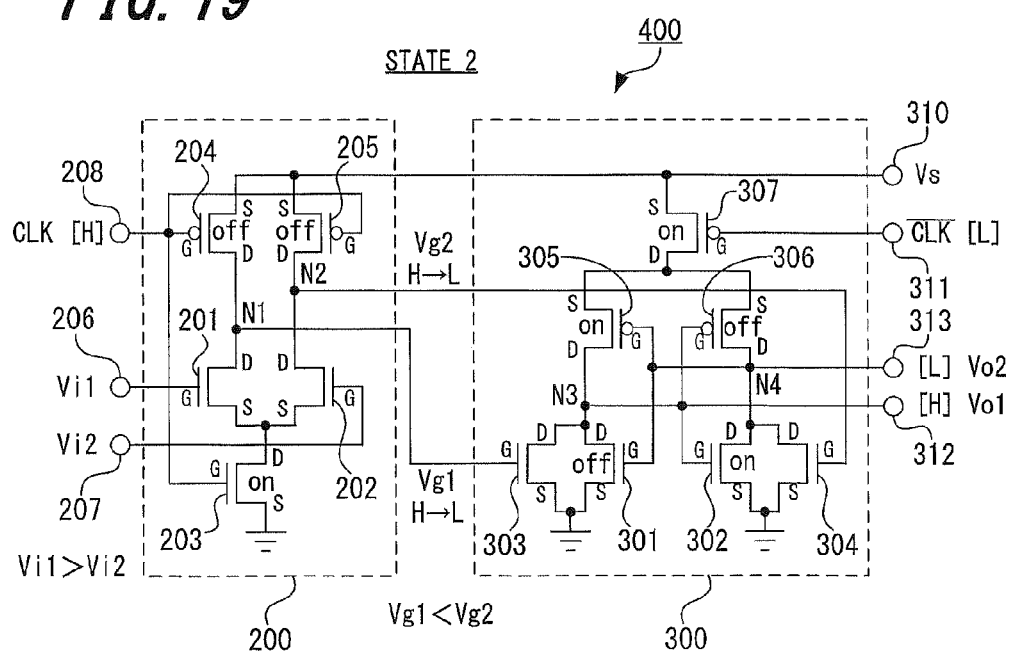
FIG. 19 is a diagram showing a state of the comparator according to the prior art during operation.

The differential preamplifier circuit section (differential amplifier circuit section) 20 includes three NMOS transistors 20 to 23 and two PMOS transistors 24 and 25. As can be known by comparing the configuration of the comparator 10 of the present embodiment shown in FIG. 1 with the configuration of the comparator 400 of the prior art shown in FIG. 18, the differential preamplifier circuit section 20 of the present embodiment has the same configuration as the differential preamplifier circuit section 200 of the prior art. The connection relation between respective transistors configuring the differential preamplifier circuit section 20 will be described below.

The gate terminal of the NMOS transistor 21 (referred to as a "first MOS transistor" hereinafter) on the normal side is connected to an input terminal 26 to which a signal of one input voltage Vi1 (referred to as a "first input voltage signal") is inputted.

The gate terminal of the NMOS transistor 22 (referred to as a "second MOS transistor" hereinafter) on the inverted side is connected to an input terminal 27 to which a signal of the other input voltage Vi2 (referred to as a "second input voltage signal") is inputted.

The gate terminal of the NMOS transistor 23 (referred to as a "third MOS transistor" hereinafter) is connected to a clock terminal 28 to which a clock signal CLK for controlling the operation of the differential preamplifier circuit section 20 is inputted. The drain terminal (input side terminal) of the third MOS transistor 23 is connected to the source terminals (output side terminals) of both the first MOS transistor 21 and the second MOS transistor 22. Further, the source terminal (output side terminal) of the third MOS transistor 23 is grounded.

The gate terminal of the PMOS transistor 24 (referred to as "fourth MOS transistor" hereinafter) is connected to the clock terminal 28. The source terminal (input side terminal) of the fourth MOS transistor 24 is connected to an input terminal 41 of a power supply voltage $V_s$. Further, the drain terminal (output side terminal) of the fourth MOS transistor 24 is connected to the drain terminal (input side terminal) of the first MOS transistor 21.

The gate terminal of the PMOS transistor 25 (referred to as a "fifth MOS transistor" hereinafter) is connected to the clock terminal 28. The source terminal (input side terminal) of the fifth MOS transistor 25 is connected to the input terminal 41 of the power supply voltage $V_s$. Further, the drain terminal (output side terminal) of the fifth MOS transistor 25 is connected to the drain terminal (input side terminal) of the second MOS transistor 22.

In the present embodiment, the fourth MOS transistor 24 and the fifth MOS transistor 25 are on-off controlled by the clock signal CLK inputted to the clock terminal 28, so that activation/inactivation of both the first MOS transistor 21 and the second MOS transistor 22 is controlled.

Further, one output voltage Vg1 of the differential preamplifier circuit section 20 is outputted from a connecting point N1 (a first connecting point; referred to as "node N1" hereinafter) between the first MOS transistor 21 and the fourth MOS transistor 24 in the differential preamplifier circuit section 20. The node N1 is connected to the gate terminals of two NMOS transistors 33 and 39 and the gate terminal of a PMOS transistor 37 in the differential latch circuit section 30 (the details of the transistors 33, 39 and will be described later). Further, in the present embodiment, the output voltage Vg1, which corresponds to the signal of the voltage Vi1 inputted to the input terminal 26 and is amplified, is outputted from the node N1, and the signal of the output voltage Vg1 (referred to as a "first output voltage signal") is used as a clock signal CLK1 for controlling the operation of the differential latch circuit section 30.

The other output voltage Vg2 of the differential preamplifier circuit section 20 is outputted from a connecting point N2 (a second connecting point; referred to as "node N2" hereinafter) between the second MOS transistor 22 and the fifth MOS transistor 25 in the differential preamplifier circuit section 20. The node N2 is connected to the gate terminals of two NMOS transistors 34 and 40 and the gate terminal of a PMOS transistor 38 in the differential latch circuit section 30 (the details of the transistors 34, 40 and will be described later). Further, in the present embodiment, the output voltage Vg2, which corresponds to the signal of the voltage Vi2 inputted to the input terminal 27 and is amplified, is outputted from the node N2, and the signal of the output voltage Vg2 (referred to as a "second output voltage signal") is used as another clock signal CLK2 for controlling the operation of the differential latch circuit section 30.

On the other hand, the differential latch circuit section 30 includes six NMOS transistors 31, 32, 33, 34, 39 and 40, and four PMOS transistors 35 to 38. The connection relation between respective transistors configuring the differential latch circuit section 30 will be described below.

The gate terminal of the NMOS transistor 31 (referred to as a "sixth MOS transistor" hereinafter) is connected to the gate terminal of the PMOS transistor 35 (referred to as a "tenth MOS transistor" hereinafter). The drain terminal (input side terminal) of the sixth MOS transistor 31 is connected to the drain terminal (output side terminal) of the tenth MOS transistor 35. Further, the source terminal (output side terminal) of the sixth MOS transistor 31 is grounded.

The gate terminal of the NMOS transistor 32 (referred to as a "seventh MOS transistor" hereinafter) is connected to the gate terminal of the PMOS transistor 36 (referred to as an "eleventh MOS transistor" hereinafter). The drain terminal (input side terminal) of the seventh MOS transistor 32 is connected to the drain terminal (output side terminal) of the eleventh MOS transistor 36. Further, the source terminal (output side terminal) of the seventh MOS transistor 32 is grounded.

A connecting point N3 between the drain terminal of the sixth MOS transistor 31 and the drain terminal of the tenth MOS transistor 35 (a third connecting point; referred to as "node N3" hereinafter) is connected not only to a connecting point between the gate terminal of the seventh MOS transistor and the gate terminal of the eleventh MOS transistor 36 (referred to as a "fifth connecting point") but also to an output terminal 42 from which one output voltage Vo1 is outputted.

A connecting point N4 between the drain terminal of the seventh MOS transistor 32 and the drain terminal of the eleventh MOS transistor 36 (a fourth connecting point; referred to as "node N4" hereinafter) is connected not only to a connecting point between the gate terminal of the sixth MOS transistor 31 and the gate terminal of the tenth MOS transistor 35 (a sixth connecting point) but also to an output terminal 43 from which the other output voltage Vo1 is outputted. In other words, the sixth MOS transistor 31, the seventh MOS transistor 32, the tenth MOS transistor 35 and the eleventh MOS transistor 36 configure a latch circuit.

The gate terminal of the NMOS transistor 33 (referred to as an "eighth MOS transistor" hereinafter) is connected to the node N1 in the differential preamplifier circuit section 20. The drain terminal (input side terminal) of the eighth MOS transistor 33 is connected to the drain terminal (input side terminal) of the sixth MOS transistor 31. Further, the source terminal (output side terminal) of the eighth MOS transistor 33 is grounded.

The gate terminal of the NMOS transistor 34 (referred to as a "ninth MOS transistor" hereinafter) is connected to the node N2 in the differential preamplifier circuit section 20. The drain terminal (input side terminal) of the ninth MOS transistor 34 is connected to the drain terminal (input side terminal) of the seventh MOS transistor 32. Further, the source terminal (output side terminal) of the ninth MOS transistor 34 is grounded.

The PMOS transistor 37 (referred to as a "twelfth MOS transistor" hereinafter) is a transistor adapted to control the operation of an inverter configured by the sixth MOS transistor 31 and the tenth MOS transistor 35. The gate terminal of the twelfth MOS transistor 37 is connected to the node N1 in the differential preamplifier circuit section 20, and the twelfth MOS transistor 37 is on-off controlled by the signal (CLK1) of the voltage Vg1 outputted from the node N1. Further, the source terminal (input side terminal) of the twelfth MOS transistor 37 is connected to the input terminal 41 of the power supply voltage $V_s$. Further, the drain terminal (output side terminal) of the twelfth MOS transistor 37 is connected to the source terminal (input side terminal) of the tenth MOS transistor 35.

The PMOS transistor 38 (referred to as a "thirteenth MOS transistor" hereinafter) is a transistor adapted to control the operation of an inverter configured by the seventh MOS transistor 32 and the eleventh MOS transistor 36. The gate terminal of the thirteenth MOS transistor 38 is connected to the node N2 in the differential preamplifier circuit section 20, and the thirteenth MOS transistor 38 is on-off controlled by the signal (CLK1) of the voltage Vg2 outputted from the node N2. Further, the source terminal (input side terminal) of the thirteenth MOS transistor 38 is connected to the input terminal 41 of the power supply voltage $V_s$. Further, the drain terminal (output side terminal) of the thirteenth MOS transistor 38 is connected to the source terminal (input side terminal) of the eleventh MOS transistor 36.

The gate terminal of the NMOS transistor 39 (referred to as a "fourteenth MOS transistor 39" hereinafter) is connected to the node N1 in the differential preamplifier circuit section 20. The drain terminal (input side terminal) of the fourteenth MOS transistor 39 is connected to the source terminal (input side terminal) of the tenth MOS transistor 35. Further, the source terminal (output side terminal) of the fourteenth MOS transistor 39 is grounded.

The gate terminal of the NMOS transistor 40 (referred to as a "fifteenth MOS transistor 40" hereinafter) is connected to the node N2 in the differential preamplifier circuit section 20. The drain terminal (input side terminal) of the fifteenth MOS transistor 40 is connected to the source terminal (input side terminal) of the eleventh MOS transistor 36. Further, the source terminal (output side terminal) of the fifteenth MOS transistor 40 is grounded.

The reason why the fourteenth MOS transistor 39 should be provided in the present embodiment and the advantages of the fourteenth MOS transistor 39 will be described below. If electrical charge is remained at the connecting point between the tenth MOS transistor 35 and the twelfth MOS transistor 37, there is a possibility that the comparator 10 might malfunction due to the influence of noise. However, if the fourteenth MOS transistor 39 is provided as shown in FIG. 1, the electrical charge remained at the connecting point between the tenth MOS transistor 35 and the twelfth MOS transistor 37 can be discharged by the fourteenth MOS transistor 39, and therefore malfunction can be reliably prevented. The reason and advantages of providing the fifteenth MOS transistor 40 are identical to the reason and advantages of providing the fourteenth MOS transistor 39 described above. Incidentally, the fourteenth MOS transistor 39 and the fifteenth MOS transistor 40 may also be eliminated in the case where the influence of noise is small.

Incidentally, the configuration of the comparator of the present invention is not limited to the example shown in FIG. 1, but may include a configuration in which the power supply voltage $V_s$ and the grounding point shown in FIG. 1 are inverted from each other, the NMOS transistors shown in FIG. 1 are replaced by PMOS transistors, and the PMOS transistors shown in FIG. 1 are replaced by NMOS transistors.

[Operation of Comparator]

Figure 4A:
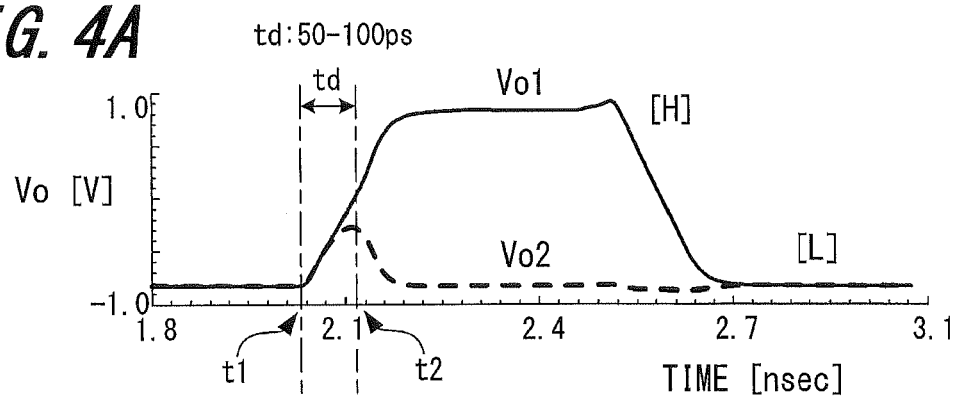
FIG. 4A is a graph showing the change of output signals of the comparator according to the first embodiment.
Figure 4B:
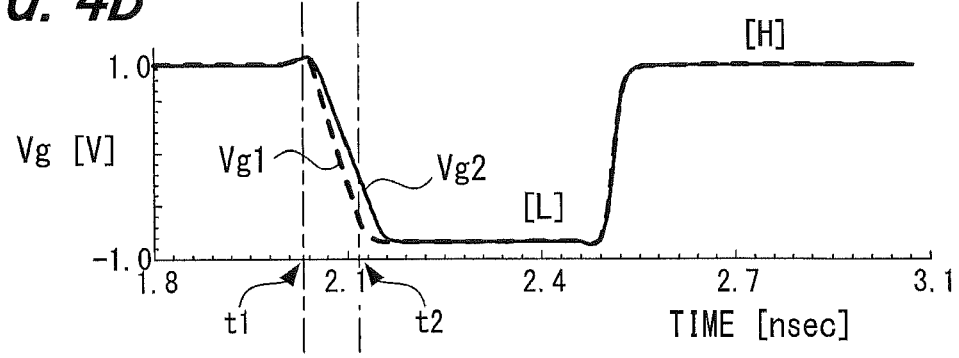
FIG. 4B is a graph showing the change of output voltages from a differential preamplifier circuit section.
Figure 4C:
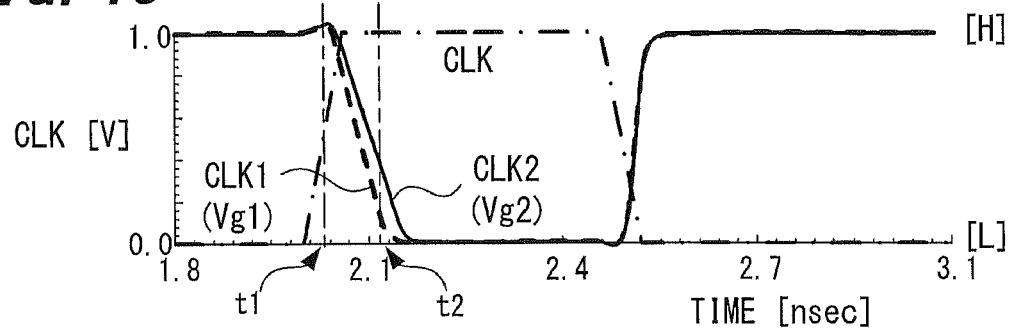
FIG. 4C is a graph showing the change of clock signals for controlling the operation of the comparator.

Next, the operation of the comparator 10 according to the present embodiment will be described below with reference to FIGS. 2, 3, 4A, 4B and 4C. FIG. 2 is a diagram showing a state of the comparator 10 in a preliminary stage (a preparatory stage) before operation (such a state will be referred to as "state 1" hereinafter). FIG. 3 is a diagram showing a state of the comparator 10 during operation (such a state will be referred to as "state 2" hereinafter). Further, FIGS. 4A, 4B and 4C are graphs respectively showing temporal change of the output voltages of the comparator 10, temporal change of the output voltages of the differential preamplifier circuit section 20, and temporal change of the clock signals adapted to control the operation of the comparator 10.

In state 1, a clock voltage of "L" state is inputted to the clock terminal 28. Thus, the fourth MOS transistor 24 and the fifth MOS transistor 25 in the differential preamplifier circuit section 20 become ON state, and the third MOS transistor 23 in the differential preamplifier circuit section 20 becomes OFF state (see FIG. 2).

In such a case, since the third MOS transistor 23 is in OFF state, no current flows through the differential preamplifier circuit section 20; however, since the fourth MOS transistor 24 and fifth MOS transistor 25 are in ON state, the voltage at the nodes N1 and N2 in the differential preamplifier circuit section 20 will increase due to the power supply voltage $V_s$. As a result, the voltages Vg1 and Vg2 respectively outputted from the nodes N1 and N2 in the differential preamplifier circuit section 20 will both become "H" state.

The signal (CLK1) of the voltage Vg1 of "H" state outputted from the node N1 is inputted to the gate terminals of the eighth MOS transistor 33, the twelfth MOS transistor 37 and the fourteenth MOS transistor 39 in the differential latch circuit section 30. Thus, the twelfth MOS transistor 37 becomes OFF state, and the eighth MOS transistor 33 and the fourteenth MOS transistor 39 become ON state.

The signal (CLK2) of the voltage Vg2 of "H" state outputted from the node N2 is inputted to the gate terminals of the ninth MOS transistor 34, the thirteenth MOS transistor and the fifteenth MOS transistor 40 in the differential latch circuit section 30. Thus, the thirteenth MOS transistor 38 becomes OFF state, and the ninth MOS transistor 34 and the fifteenth MOS transistor 40 become ON state.

Thus, in state 1, since the twelfth MOS transistor 37 and the thirteenth MOS transistor 38 are both in OFF state, no current flows from the side of the power supply voltage $V_s$ to the latch circuit, which is configured by the sixth MOS transistor 31, the seventh MOS transistor 32, the tenth MOS transistor 35 and the eleventh MOS transistor 36. Further, since the eighth MOS transistor 33 and the ninth MOS transistor 34 are in ON state, the nodes N3 and N4 in the differential latch circuit section 30 become the same potential as the ground (i.e., become zero potential). As a result, the voltages Vo1 and Vo2 outputted respectively from output terminals 42 and 43 of the comparator 10 both become "L" state (see FIG. 2). Incidentally, in state 1, no current flows through the differential preamplifier circuit section 20 and the differential latch circuit section 30.

Further, in state 1, since the fourteenth MOS transistor 39 is in ON state, the electrical charge remained at the connecting point between the tenth MOS transistor 35 and the twelfth MOS transistor 37 can be completely discharged. Similarly, in state 1, since the fifteenth MOS transistor 40 is in ON state, the electrical charge remained at the connecting point between the eleventh MOS transistor 36 and the thirteenth MOS transistor 38 can be completely discharged.

Incidentally, in characteristics shown in FIGS. 4A to 4C, the characteristic before time t1 indicates the change of the output voltages Vo1 and Vo2 of the comparator 10, the change of the output voltages Vg1 and Vg2 of the differential preamplifier circuit section 20, and the change of the clock voltages in state 1. However, in the characteristics shown in FIGS. 4A to 4C, the "H" state corresponds to 1 [V], and the "L" state corresponds to 0 [V].

Next, the state of the comparator 10 during operation (i.e., state 2) will be described below with reference to FIG. 3. However, the example shown in FIG. 3 is based on a case where the voltage Vi1 inputted to one input terminal 26 of the comparator 10 is higher than the voltage Vi2 inputted to the other input terminal 27 of the comparator 10 (i.e., Vi1>Vi2).

In state 2, the clock voltage inputted to the clock terminal 28 changes to "H" state. Thus, the fourth MOS transistor 24 and the fifth MOS transistor 25 in the differential preamplifier circuit section 20 become OFF state, and the third MOS transistor 23 in the differential preamplifier circuit section 20 becomes ON state. Since the voltage values of the nodes N1 and N2 in the differential preamplifier circuit section 20 was in "H" state in state 1 (i.e., the preparatory stage), when the third MOS transistor 23 becomes ON state in state 2, current will flow from the nodes N1 and N2 to the ground through the first MOS transistor 21, the second MOS transistor 22 and the third MOS transistor 23. As a result, the voltage values of the nodes N1 and N2 will decrease with elapse of time and transit to "L" state.

However, at this time, currents corresponding to the voltages Vi1 and Vi2 applied to the gate terminals of the first MOS transistor 21 and the second MOS transistor 22 will flow through the first MOS transistor 21 and the second MOS transistor 22. In the example shown in FIG. 3, since Vi1>Vi2, the current flowing through the first MOS transistor 21 is larger than the current flowing through the second MOS transistor 22. As a result, the voltage drop rate of the output voltage Vg1 at the node N1 with respect to the time is larger than the voltage drop rate of the output voltage Vg2 at the node N2 with respect to the time.

Figure 20A:
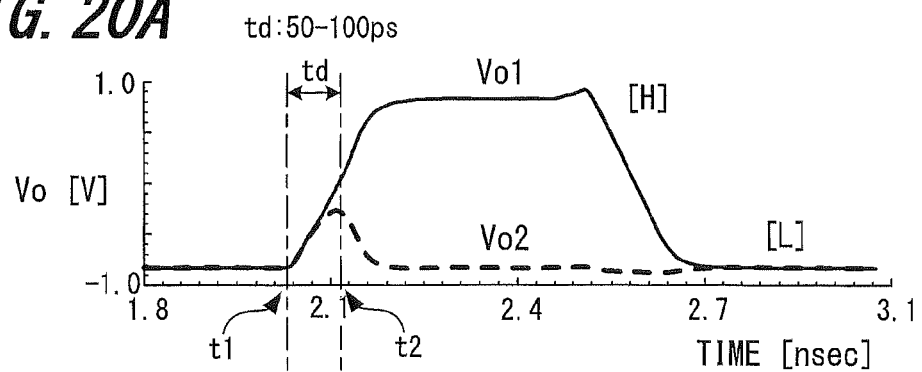
FIG. 20A is a graph showing the change of output signals of the comparator according to the prior art.
Figure 20B:
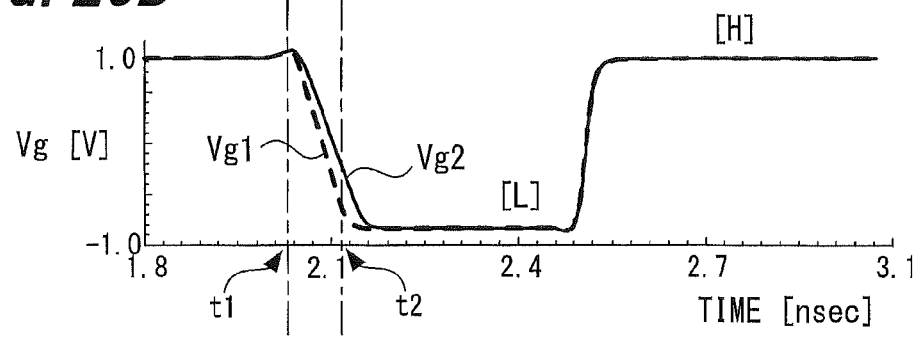
FIG. 20B is a graph showing the change of output voltages from a differential preamplifier circuit section.
Figure 20C:
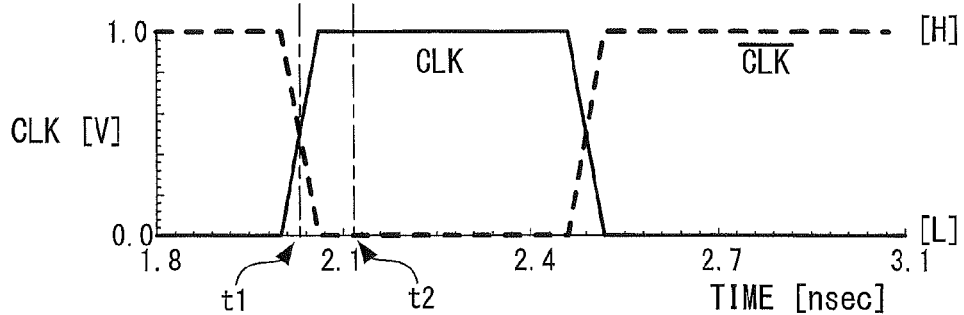
FIG. 20C is a graph showing the change of clock signals adapted to control the operation of the comparator.

Such circumstance is shown in FIG. 20B. After the state of the comparator 10 is switched to state 2 (i.e., after time t1), the output voltage Vg1 at the node N1 transits to "L" state more early than the output voltage Vg2 at the node N2. Thus, during the period between the time when the operation starts and the time when the output voltage Vg2 transits to "L" state, the output voltage Vg2 (CLK2) is higher than the output voltage Vg1 (CLK1). In other words, during the transition period of the output voltage Vg2, the gate voltage of the ninth MOS transistor 34 is higher than the gate voltage of the eighth MOS transistor 33 in the differential latch circuit section 30. Further, in state 2, since the output voltage Vg1 transits to "L" state more early than the output voltage Vg2, the eighth MOS transistor 33 becomes OFF state more early than the ninth MOS transistor 34.

Further, during the transition period of the output voltage Vg2 of the node N2, the gate voltages (Vg1 and Vg2) of the twelfth MOS transistor 37 and the thirteenth MOS transistor 38 in the differential latch circuit section 30 begins to decrease. Thus, since the twelfth MOS transistor 37 and the thirteenth MOS transistor 38 both approach ON state, current begins to flow through the latch circuit, which is configured by the sixth MOS transistor 31, the seventh MOS transistor 32, the tenth MOS transistor 35 and the eleventh MOS transistor 36. However, at this time, since the eighth MOS transistor 33 approaches OFF state more early than the ninth MOS transistor 34 in the differential latch circuit section 30, the output voltage Vo1 at the node N3 is slightly higher than the output voltage Vo2 at the node N4.

The change of the output voltages Vo1 and Vo2 of the comparator 10, the change of the output voltages Vg1 and Vg2 of the differential preamplifier circuit section 20 and the change of the clock voltages during the transition period of the output voltage Vg2 at the node N2 will be described below with reference to FIGS. 4A to 4C. When the state of the comparator 10 is switched to state 2 (i.e., after time t1), since current begins to flow through the latch circuit, the output voltages Vo1 and Vo2 at the nodes N3 and N4 both begin to increase from "L" state (see FIG. 4A). However, during the during the transition period of the output voltage Vg2 at the node N2, since a potential difference is generated between the gate voltage (Vg2) of the ninth MOS transistor 34 and the gate voltage (Vg1) of the eighth MOS transistor 33 (Vg2>Vg1, see FIG. 4B), the output voltage Vo1 at the node N3 begins to become higher than the output voltage Vo2 at the node N4 near time t2 shown in FIG. 4A. Incidentally, the period td between the time when the state is switched and the time when the output voltage Vo1 at the node N3 begins to be higher than the output voltage Vo2 at the node N4 is about 50 to 100 psec.

Thus, the state of the seventh MOS transistor 32 whose gate terminal is connected to the node N3 is closer to ON state. Further, the state of the eleventh MOS transistor 36 whose gate terminal is connected to the node N3 is closer to OFF state. As a result, current becomes easy to flow through the seventh MOS transistor 32, and therefore the voltage of the node N4 begins to decrease.

Further, at this time, the output voltage Vo1 of the node N3 is higher than the output voltage Vo2 of the node N4, and thereby the state of the sixth MOS transistor 31 whose gate terminal is connected to the node N4 is closer to OFF state. Further, the state of the tenth MOS transistor 35 whose gate terminal is connected to the node N4 is closer to ON state. As a result, current becomes difficult to flow through the sixth MOS transistor 31, and therefore the voltage of the node N3 begins to increase.

In the differential latch circuit section 30, the aforesaid operation is repeated over time during the transition period of the output voltage Vg2 of the node N2, so that the output voltage Vo1 of the node N3 continues to increase, and the output voltage Vo2 of the node N4 continues to decrease (see FIG. 4A). In other words, during the transition period of the output voltage Vg2 of the node N2, positive feedback operates in the latch circuit, which is configured by the sixth MOS transistor 31, the seventh MOS transistor 32, the tenth MOS transistor 35 and the eleventh MOS transistor 36, and finally the output voltage Vo1 of the node N3 is fixed in "H" state, and the output voltage Vo2 of the node N4 is fixed in "L" state. Thus, the comparison state (i.e., the comparison result) of the input voltages Vi1 and Vi2 is kept in the differential latch circuit section 30 and outputted from the output terminals 42 and 43.

Incidentally, after the voltage values (the output voltages) of the nodes N3 and N4 are fixed, since the gate voltages (Vg1 (CLK1) and Vg2 (CLK2)) applied to the eighth MOS transistor 33 and the ninth MOS transistor 34 both become "L" state, these two transistors are in OFF state, and therefore no steady current flows in the differential latch circuit section 30.

The comparator 10 according to the present embodiment operates in the aforesaid manner. Incidentally, in the comparator 10 according to the present embodiment, the combination of the states (i.e., "L" state or "H" state) of the output voltages Vo1 and Vo2 during the operation changes depending on the magnitude relation between the input voltage Vi1 and input voltage V12. Further, the output signal of the comparator 10 may be either one of the signal of the output voltage Vo1 and the signal of the output voltage Vo2, or be a differential signal between the both signals.

As can be known from the above operation description, the comparator 10 of the present embodiment performs the same operation as that of the comparator 400 of the prior art described with reference to FIGS. 18, 19, 20A, 20B and 20C. However, in the present embodiment, since the operation of the differential latch circuit section 30 is controlled using the output signals (Vg1 and Vg2) from the differential preamplifier circuit section 20, the rising/falling timing of the voltage signals (Vg1 and Vg2) for controlling the operation of the differential latch circuit section 30 does not depend on the timing of the clock signal CLK inputted to the differential preamplifier circuit section 20. Thus, in the present embodiment, the problems caused by the timing-skew between two clock signals with different polarities in the comparator 400 of the prior art can be solved. Thus, with the comparator 10 of the present embodiment, it is possible to perform operation more stably than the prior art.

Further, in the present embodiment, since only one clock signal is inputted to the comparator 10, the number of clock circuits can be reduced compared with the prior art, and therefore the comparator can be driven with lower power than the prior art.

Further, in the comparator 10 according to the present embodiment, the current flowing through the inverter, which is configured by the sixth MOS transistor 31 and the tenth MOS transistor 35, is controlled by the twelfth MOS transistor 37 and the eighth MOS transistor 33. In the present embodiment, since the common control signal (Vg1) is inputted to both the gate terminal of the twelfth MOS transistor 37 and the gate terminal of the gate terminal of the eighth MOS transistor 33, operation of pushing current into the inverter with the twelfth MOS transistor 37 and operation of pulling current into the inverter with the eighth MOS transistor 33 are performed in synchronization. In other words, the circuit configured by these transistors is a push-pull current control circuit. Similarly, the circuit configured by the thirteenth MOS transistor 38, the eleventh MOS transistor 36, the seventh MOS transistor 32 and the ninth MOS transistor 34 is also a push-pull current control circuit. Thus, in the present embodiment, due to push-pull function of current, the operation speed of the latch circuit, which is configured by the sixth MOS transistor 31, the seventh MOS transistor 32, the tenth MOS transistor 35 and the eleventh MOS transistor 36, (i.e., the operation speed of the comparator 10) can be increased, and therefore sensitivity can be improved.

Figure 5:
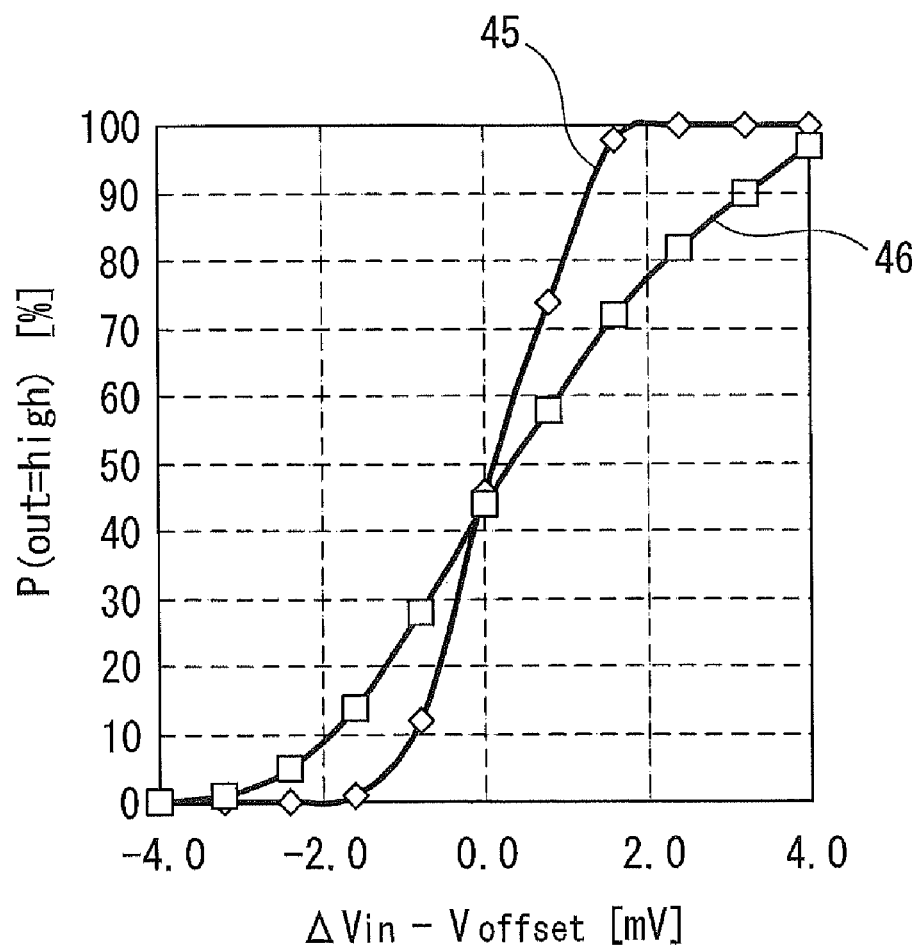
FIG. 5 is a graph showing comparator's sensitivity characteristics.

FIG. 5 is a graph showing the sensitivity characteristic of the comparator 10 of the present embodiment and the sensitivity characteristic of the comparator 400 of the prior art. In the graph shown in FIG. 5, the horizontal axis represents a value obtained by subtracting an offset voltage $V_{offset}$ of the comparator from a transition voltage $\Delta V_{in}$ (difference between a reference voltage and the input voltage). The position of the "0 [V]" on the horizontal axis shown in FIG. 5 represents a threshold voltage for discriminating whether the signal outputted from the comparator is in "H" state or in "L" state. Further, the vertical axis in FIG. 5 represents the probability P with which the comparator outputs a signal of "H" state; the more the voltage value of the horizontal axis goes to positive side, the higher the probability P with which the comparator outputs a signal of "H" state becomes. Incidentally, in FIG. 5, the characteristic 45 with diamond marks represents the sensitivity characteristic of the comparator 10 of the present embodiment, and the characteristic 46 with square marks represents the sensitivity characteristic of the comparator 400 of the prior art.

Incidentally, in an ideal comparator, with the voltage value "0 [V]" on the horizontal axis as a reference, if the voltage value is on the positive side, a signal of "H" state will be outputted from the comparator with a probability of 100%; and if the voltage value is on the negative side, a signal of "L" state will be outputted from the comparator with a probability of 100%. However, in an actual comparator, due to the influence of thermal noise of the circuit and the like, the comparator has a sensitivity characteristic that has a slope near the voltage value 0 [V] as shown in FIG. 5, and the probability P with which the comparator outputs a signal of "H" state is about 50% near the voltage value 0 [V]. In order to obtain a comparator having high sensitivity and high accuracy, in the sensitivity characteristic shown in FIG. 5, it is necessary to increase the slope of the sensitivity characteristic near the voltage value 0 [V].

As can be known from FIG. 5, the slope of the sensitivity characteristic 45 of the comparator 10 of the present embodiment near the voltage value 0 [V] is larger than that of the comparator 400 of the prior art. Further, when obtaining a standard deviation $\Delta V_m(\sigma)$, the standard deviation $\Delta V_{in}(\sigma)$ of the comparator 10 of the present embodiment is $\Delta V_{in}(\sigma)=0.66$ [mV], while the standard deviation of the comparator 400 of the prior art is $\Delta V_{in}(\sigma)=2.1$ [mV]. It is known from this result that the sensitivity of the comparator 10 of the present embodiment is about three time higher than the comparator 400 of the prior art.

It is known from the above description that, with the present embodiment, it is possible to provide a comparator which not only can perform low power and stable operation, but also can perform operation with high sensitivity (high accuracy) compared to the comparator of the prior art.

[Configuration of A/D Converter]

Figure 6:
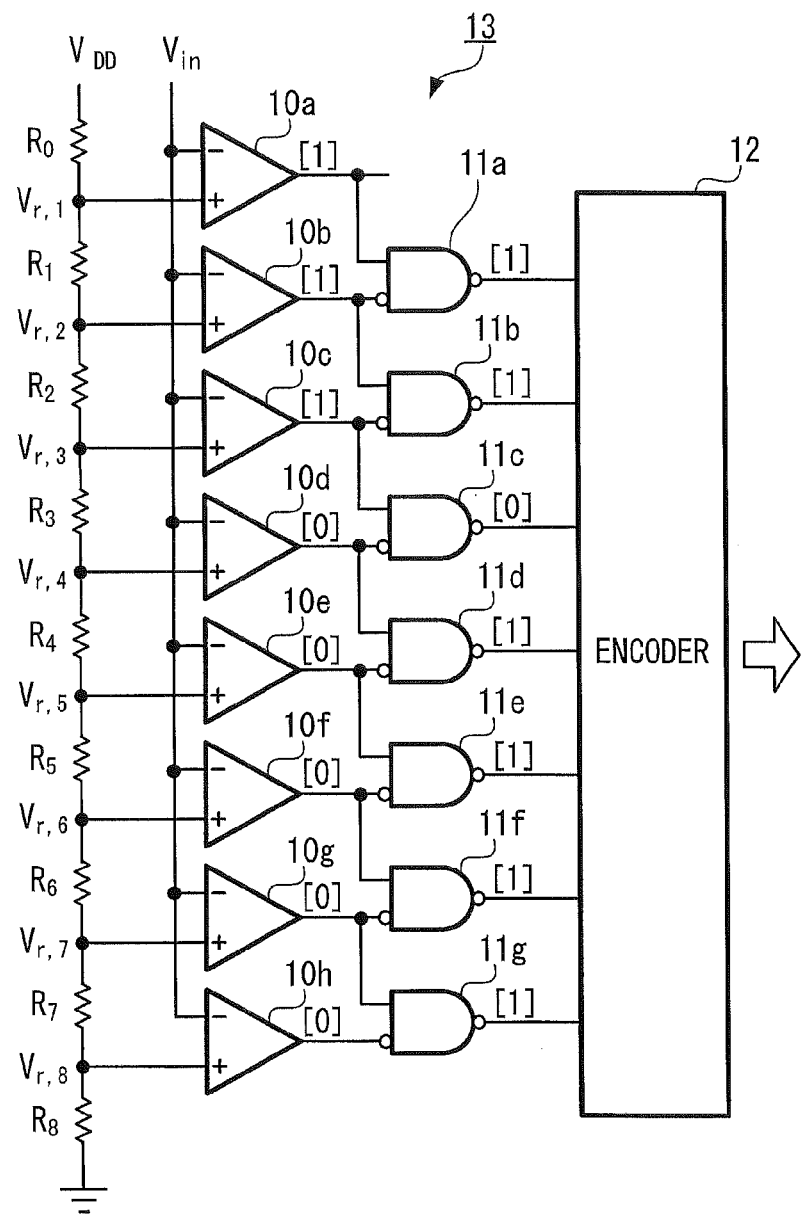
FIG. 6 is a diagram showing a schematic configuration of an A/D converter according to the first embodiment.

Next, an example of an A/D converter to which the comparator 10 of the present embodiment is applied will be described below. FIG. 6 shows a configuration example of an A/D converter 13. The A/D converter 13 shown in FIG. 6 is a parallel-type A/D converter. The A/D converter 13 mainly includes a plurality of comparators 10a to 10h arranged in parallel, a plurality of NAND circuits 11a to 11g arranged in parallel, an encoder 12, and a plurality of resistors $R_0$ to $R_8$ connected in series.

The input terminal of each of the comparators 10a to 10h on the positive side is connected to a connecting point between every two resistors, and a reference voltage (any one of $V_{r,1}$ to $V_{r,8}$) obtained by resistance-dividing a power supply voltage $V_{DD}$ by the resistors $R_0$ to $R_8$ is inputted to the input terminal of each of the comparators 10a to 10h on the positive side. On the other hand, an input voltage $V_{in}$ to be compared with the reference voltage is inputted to an input terminal of each of the comparators 10a to 10h on the negative side. In other words, any one of the reference voltages $V_{r,1}$ to $V_{r,8}$ resistance-divided by the resistors $R_0$ to $R_8$ becomes one of the input voltages Vi1 and Vi2 shown in FIG. 1, and the input voltage $V_{in}$ to be compared becomes the other one of the input voltages Vi1 and Vi2.

Further, one of the two input terminals of each of the NAND circuits 11a to 11g is inverted. Hereinafter, the input terminal that is inverted will be referred to as "inverted input terminal", and the input terminal that is not inverted will be referred to as "normal input terminal". The inverted input terminal of each of the NAND circuits 11a to 11g is connected to the output terminal of the respective one of the comparators 10a to 10h. Further, the normal input terminal of each of the NAND circuits 11a to 11g is connected to the inverted input terminal of the neighboring NAND circuit arranged on the higher potential side than itself and the output terminal of the comparator. Further, the output terminal of each other NAND circuits 11a to 11g is connected to the encoder 12.

Figure 7:
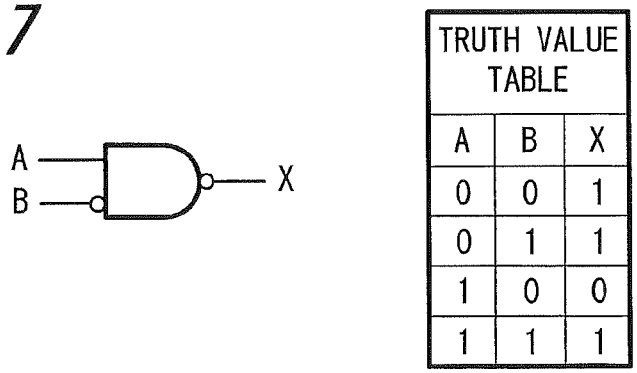
FIG. 7 is a truth value table showing relation between an input signal and an output signal of a NAND circuit used in the first embodiment.

FIG. 7 is a truth value table showing a relation between the input signal and the output signal of the NAND circuit whose one input terminal is inverted. As shown in FIG. 7, in the NAND circuit used in the present embodiment, the signal "0" (i.e., the signal of "L" state) is outputted only in the case where the input signal's combination [A, B]=[1, 0], and the signal "1" (i.e., the signal of "H" state) is outputted in other cases.

Further, based on the signals outputted from the plurality of NAND circuits 11a to 11g, the encoder 12 outputs the digital signal encoded corresponding to the input signal.

[Operation of A/D Converter]

Next, the operation of the A/D converter 13 of the present embodiment will be described below in brief with reference to FIG. 6. Incidentally, each of the comparators 10a to 10h outputs a signal "0" when $V_{in}$ is larger than the resistance-divided reference voltage, and outputs a signal "1" when $V_{in}$ is smaller than the resistance-divided reference voltage. Further, in the example shown in FIG. 6, the signal "1" corresponds to 1 [V], and the signal "0" corresponds to 0 [V]. Furthermore, in the example shown in FIG. 6, $V_{in}$ is smaller than $V_{r,3}$ but larger than $V_{r,4}$ (i.e., $V_{r,3}>V_{in}>V_{r,4}$).

When the input voltage $V_{in}$ (an analog signal) is inputted to the A/D converter 13, since the $V_{in}$ is smaller than $V_{r,3}$ but larger than $V_{r,4}$, the output signal of each of the comparator 10a to 10c is "1", and the output signal of each of the comparator 10d to 10h is "0". As a result, the combination of the signals inputted to the NAND circuits 11a and 11b is [1, 1], and therefore the output signals of the NAND circuits 11a and 11b are "1". Further, the combination of the signals inputted to the NAND circuit 11c is [1, 0], and therefore the output signal of the NAND circuit 11c is "0". The combination of the signals inputted to the NAND circuits 11d to 11g is [0, 0], and therefore the output signals of the NAND circuits 11d to 11g are "1". In other words, only the output signal of the NAND circuit 11c is "0", so that the range of $V_{in}$ is confirmed.

Next, based on the output signals of the NAND circuits 11a to 11g, the encoder 12 outputs the digital signal encoded corresponding to the input voltage $V_{in}$. The A/D converter 13 of the example shown in FIG. 6 operates in the aforesaid manner. In the configuration example of the A/D converter 13 shown in FIG. 6, since the comparator 10 of the present embodiment is used, the A/D converter not only can perform stable operation, but also can perform operation with high sensitivity (high accuracy) and low power.

Second Embodiment

Generally, since the size of the NMOS and PMOS transistors for configuring the aforesaid comparator is very small, there is variation in threshold voltage of these transistors. In such case, offset will be generated in the reference voltage for discriminating the output signal based on the difference between the two voltages inputted to the comparator. Further, such offset voltage is different for each comparator. When the offset voltage of the comparator becomes large, the probability of malfunction will become high; therefore it is preferred to reduce the offset voltage as much as possible.

The offset voltage of a comparator using tiny CMOS transistors in recent years is about 30 [mV]. However, since quantized voltage $V_{qn}$ of an A/D converter with a resolution of N bit is expressed by $V_{qn}=V_{pp}/2N$, when the signal amplitude $V_{pp}=2$ [V] and N=10 bit, the quantized voltage $V_{qn}$ will be about 2 [mV]. In such a case, if reference is set to ¼LSB, the offset voltage is necessary to be 0.5 [mV] or lower. In the present embodiment, a configuration example for reducing the offset voltage of the comparator of the first embodiment to, for example, several mV or lower will be described.

[Configuration of Comparator]

Figure 8:
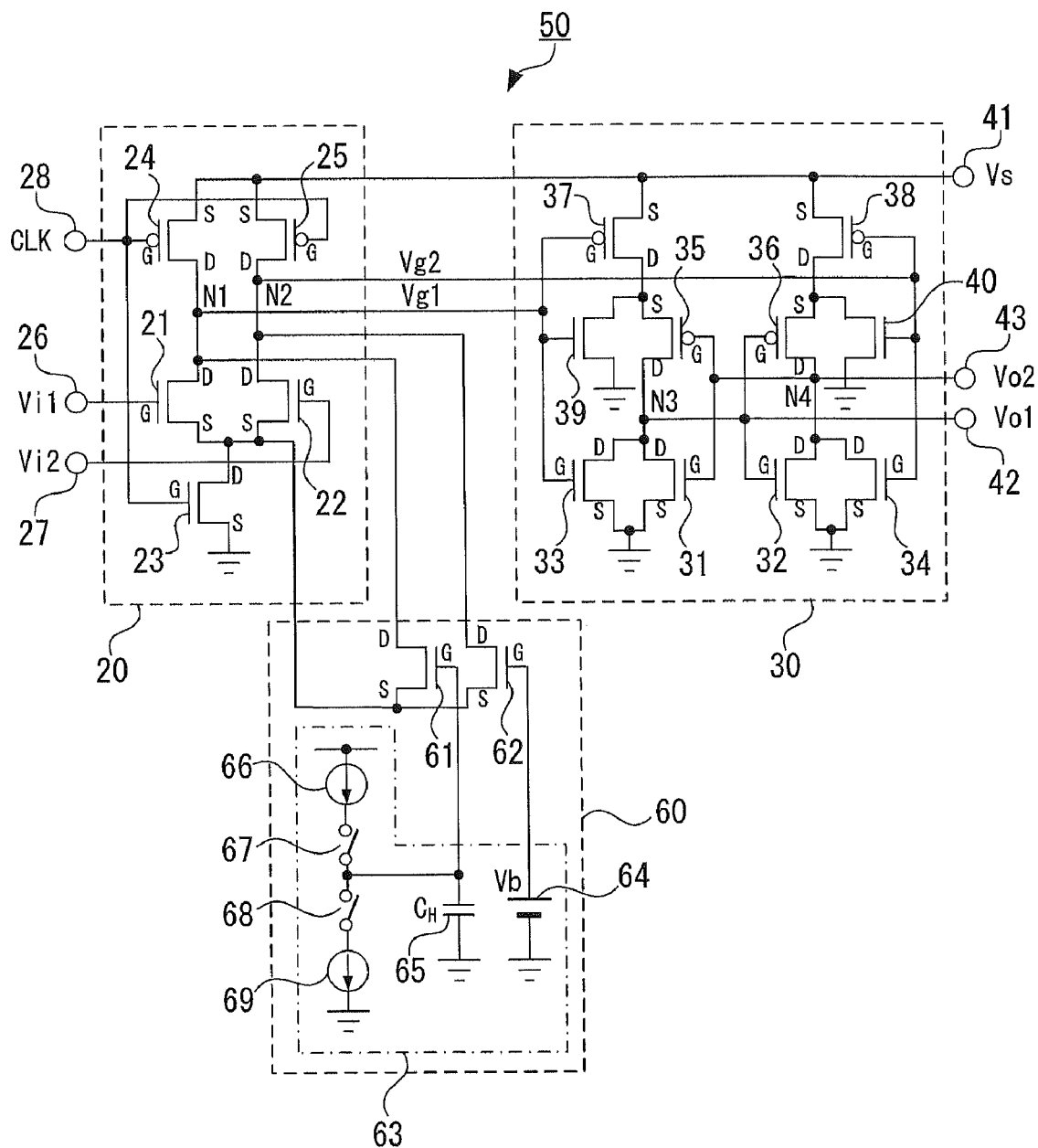
FIG. 8 is a diagram showing a schematic circuit configuration of a comparator according to a second embodiment of the present invention.

FIG. 8 shows a circuit configuration of a comparator 50 according to the second embodiment of the present invention. The comparator 50 mainly includes a dynamic differential preamplifier circuit section 20 arranged on an input side (a first stage), a differential latch circuit section 30 arranged on an output side (a second stage), and an offset voltage compensating circuit section 60 connected to the differential preamplifier circuit section 20. Note that, in the description of the comparator 50 of the present embodiment shown in FIG. 8, like components are denoted by like reference numerals as of the comparator 10 of the first embodiment.

The differential preamplifier circuit section 20 and the differential latch circuit section 30 of the comparator 50 have the same configuration as those of the first embodiment. Thus, description of the differential preamplifier circuit section 20 and the differential latch circuit section 30 will be omitted here. Incidentally, in FIG. 8, the symbols G, S and D respectively represent a gate terminal, a source terminal and a drain terminal of each transistor.

The offset voltage compensating circuit section 60 mainly includes two NMOS transistors 61 and 62 (respectively referred to as "first compensation MOS transistor" and "second compensation MOS transistor" hereinafter), and a voltage adjusting section 63 for adjusting the gate voltages of these transistors. Incidentally, the first and second compensation MOS transistors 61 and 62 may also be PMOS transistors.

Further, although not shown in FIG. 8, the offset voltage compensating circuit section 60 has a control circuit section and a switching section, wherein the control circuit section is adapted to control the on-off operation of switches 67 and 68 in the voltage adjusting section 63, and the switching section is adapted to switch between a compensation operation of the offset voltage and the usual comparison operation of the comparator 50.

The voltage adjusting section 63 includes a bias power supply 64, a capacitor 65, two charge pumps 66 and 69 (respectively referred to as a "first charge pump" and a "second charge pump" hereinafter), and two switches 67 and 68.

The output terminal of the first charge pump 66 is connected to one terminal of the switch 67, and the other terminal of the switch 67 is connected to one terminal of the switch 68. The other terminal of the switch 68 is connected to the input terminal of the second charge pump 69, and the output terminal of the second charge pump 69 is grounded. The connecting point between the two switches 67 and 68 is connected to the ungrounded terminal of the capacitor 65.

The gate terminal of the first compensation MOS transistor 61 is connected to the ungrounded terminal of the capacitor 65. The drain terminal (input side terminal) of the first compensation MOS transistor 61 is connected to the connecting point between the first MOS transistor 21 and the fourth MOS transistor 24 in the differential preamplifier circuit section 20. Further, the source terminal (output side terminal) of the first compensation MOS transistor 61 is connected to the source terminals (output side terminals) of the first MOS transistor 21 and the second MOS transistor 22.

The gate terminal of the second compensation MOS transistor 62 is connected to the bias power supply 64. The drain terminal (input side terminal) of the second compensation MOS transistor 62 is connected to the connecting point between the second MOS transistor 22 and the fifth MOS transistor 25 in the differential preamplifier circuit section 20. Further, the source terminal (output side terminal) of the second compensation MOS transistor 62 is connected to the source terminals (output side terminals) of the first MOS transistor 21 and the second MOS transistor 22.

Figure 9:
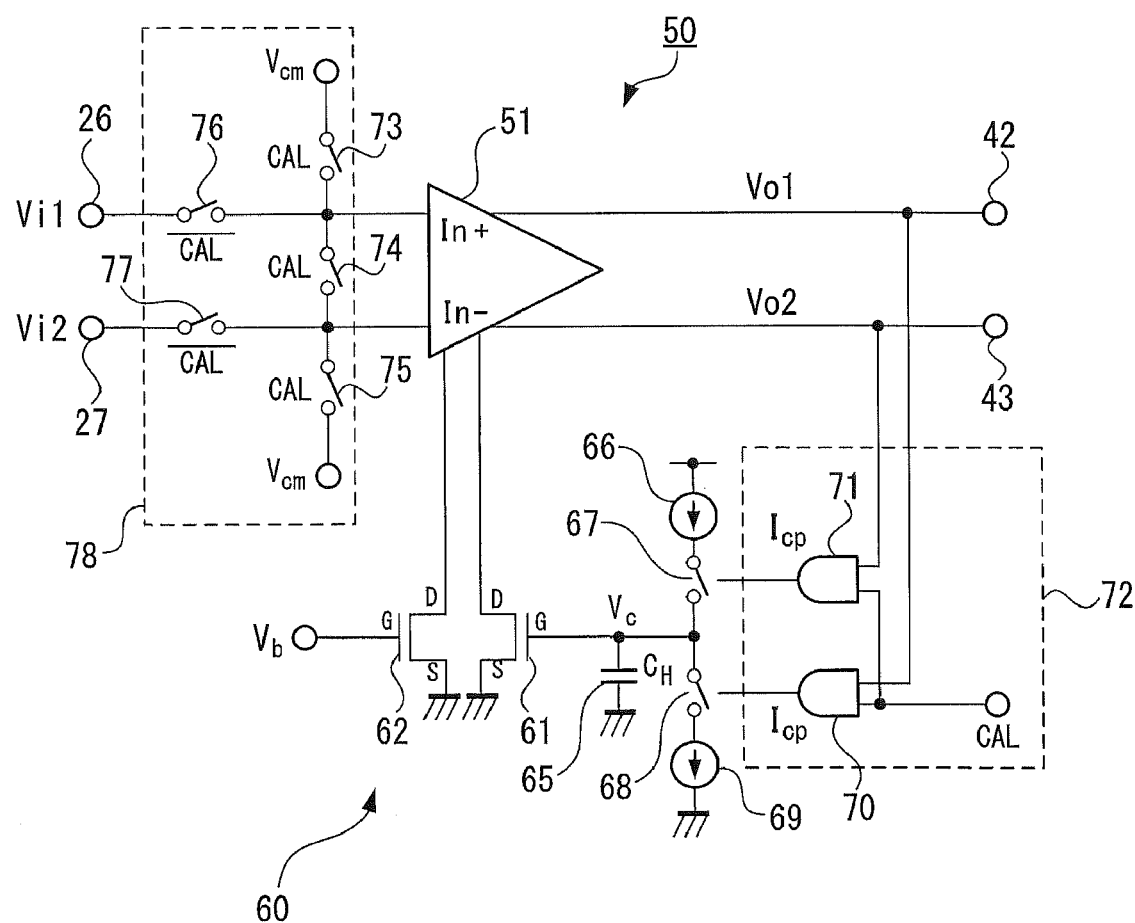
FIG. 9 is a diagram showing a more detailed configuration of the comparator according to the second embodiment.

FIG. 9 is a diagram showing a more detailed configuration example of the comparator 50 which includes the control circuit section adapted to control the on-off operation of switches 67 and 68 and the switching section adapted to switch between the compensation operation of the offset voltage and the usual comparison operation. In FIG. 9, the area 72 and the area 78 bounded by broken lines are respectively the control circuit section and the switching section. Incidentally, in FIG. 9, the differential preamplifier circuit section 20 and the differential latch circuit section 30 are correctively represented by a circuit element 51, so that the diagram is simplified.

The control circuit section 72 includes a first AND circuit 70 and a second AND circuit 71. A signal of one output voltage Vo1 of the comparator 50 and a calibration signal CAL are inputted to the first AND circuit 70. Base on these input signals, the first AND circuit 70 controls the on-off operation of the switch 68. On the other hand, a signal of the other output voltage Vo2 of the comparator 50 and the calibration signal CAL are inputted to the second AND circuit 71. Base on these input signals, the second AND circuit 71 controls the on-off operation of the switch 67.

The switching section 78 includes five switches 73 to 77 for switching between the compensation operation of the offset voltage and the usual comparison operation of the comparator 50.

The switch 74 is arranged between the input terminals of the comparator 50. One terminal of the switch 74 is connected to the switch 73, and the other terminal of the switch 74 is connected to the switch 75. Further, the terminal of the switch 73 unconnected to the switch 74 and the terminal of the switch 75 unconnected to the switch 74 are connected to input terminals of a driving bias power supply $V_{cm}$ for causing the comparator 50 to operate when performing the compensation operation of the offset voltage. The on-off operation of the switches 73 to 75 is controlled by the calibration signal CAL inputted to the first AND circuit 70 and the second AND circuit 71.

On the other hand, the switch 76 is arranged between the input terminal 26 and the circuit element 51, and the switch 77 is arranged between the input terminal 27 and the circuit element 51. The on-off operation of these switches is controlled by a signal with opposite phase to the calibration signal CAL.

Further, in the present embodiment, when the comparator 50 is performing the compensation operation of the offset voltage, the switches 73 to 77 are controlled so that the switches 73 to 75 are closed and the switch 76 and switch 77 are opened. Further, when the comparator 50 is performing the usual comparison operation, the switches 73 to 77 are controlled so that the switches 73 to 75 are opened and the switch 76 and switch 77 are closed.

[Compensation Operation of Offset Voltage]

Next, the compensation operation of the offset voltage will be described. However, before describing the concrete compensation operation, the principle of the compensation operation of the offset voltage will be described first.

First, the portion between the input terminals 26 and 27 of the comparator 50 is short-circuited, so that the gate voltage of the first MOS transistor 21 and the gate voltage of the second MOS transistor 22 in the differential preamplifier circuit section 20 have the same potential. If the comparator 50 is operated in such a state, current will flow into the first MOS transistor 21 (the normal side transistor) and the second MOS transistor 22 (the inverted side transistor). At this time, if there is offset voltage in the comparator 50, the value of the current flowing into the first MOS transistor 21 and the value of the current flowing into the second MOS transistor 22 will be different (i.e., the current flowing into the first MOS transistor 21 and the current flowing into the second MOS transistor 22 will be unbalanced). While if there is no offset voltage in the comparator 50, the value of the current flowing into the first MOS transistor 21 and the value of the current flowing into the second MOS transistor 22 will be equal to each other (i.e., the current flowing into the first MOS transistor 21 and the current flowing into the second MOS transistor 22 will be balanced).

In the compensation operation of the comparator 50 of the present embodiment, the gate voltage of the first compensation MOS transistor 61 and the gate voltage of the second compensation MOS transistor 62 are adjusted relative to each other so that the value of the current flowing into the first MOS transistor 21 and the value of the current flowing into the second MOS transistor 22 are equal to each other in the state where the portion between the input terminals 26 and 27 is short-circuited. However, in the present embodiment, the judgment of whether or not the current flowing into the first MOS transistor 21 and the current flowing into the second MOS transistor 22 are balanced is performed by monitoring the change of the voltage signal (Vo1 and/or Vo2) outputted from the comparator 50 during the compensation operation.

As having been described with reference to the sensitivity characteristic of the comparator shown in FIG. 5, when the value obtained by subtracting the offset voltage $V_{offset}$ of the comparator from the transition voltage $\Delta V_{in}$ (difference between the reference voltage and the input voltage) is in the vicinity of 0 [V], the probability with which the comparator outputs a signal of "H" state and the probability with which the comparator outputs a signal of "L" state are both substantially 50%. In other words, in the case where the input voltage difference is 0 [V] and where the current flowing into the first MOS transistor 21 and the current flowing into the second MOS transistor 22 are balanced (i.e., where offset voltage is 0 [V]), the probability with which the comparator outputs a signal of "H" state and the probability with which the comparator outputs a signal of "L" state are substantially the same.

In the present embodiment, during the compensation operation, the gate voltage of the first compensation MOS transistor 61 and the gate voltage of the second compensation MOS transistor 62 are adjusted relative to each other so that the probability with which the comparator 50 outputs a signal of "H" state and the probability with which the comparator 50 outputs a signal of "L" state are substantially the same.

Next, the compensation operation of the offset voltage of the present embodiment will be described in detail with reference to FIGS. 8 to 10. Incidentally, FIG. 10 is a graph showing the change of potential $V_c$ of the capacitor 65, the change of the output voltage $V_o$ of the comparator 50, and the change of the clock signal during the compensation operation.

Figure 10:
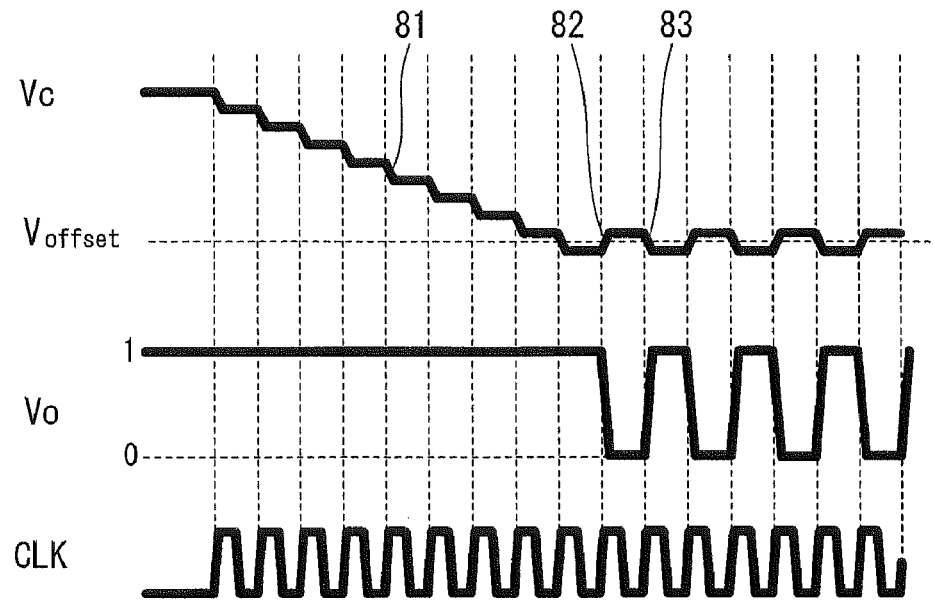
FIG. 10 is a graph for explaining compensation operation of the comparator according to the second embodiment.

In the example of FIG. 10, a bias voltage $V_b$ applied to the gate terminal of the second compensation MOS transistor 62 is set to a predetermined value, and the offset voltage is compensated by adjusting the gate voltage of the first compensation MOS transistor 61 (i.e., the potential $V_c$ of the capacitor 65). The example of FIG. 10 is a case where a signal of "H" state (i.e., $V_o$=1 [V]) is continuously outputted from the comparator 50 at the beginning of the compensation operation. Further, the output from the comparator 50 can be changed to a signal of "L" state (i.e., $V_o$=0 [V]) by decreasing the potential $V_c$ of the capacitor 65.

First, the switches 73 to 75 are closed by the calibration signal CAL, and thereby the comparator 50 is operated to start the compensation operation of the offset voltage. Since a signal of "H" state ($V_o$=1 [V] in FIG. 10) is continuously outputted from the comparator 50 at the beginning of the compensation operation, the potential $V_c$ of the capacitor 65 is decreased. At this time, the switch 68 is closed by the control circuit section 72 and therefore the capacitor 65 is discharged by the second charge pump 69, so that the potential $V_c$ of the capacitor 65 is decreased.

The potential $V_c$ of the capacitor 65 is decreased step by step in clock unit (steps 81 in FIG. 10) until a signal of "L" state (i.e., $V_o$=0 [V]) is outputted from the comparator 50. Thus, as the number of clocks increases, the offset voltage decreases. When the offset voltage becomes sufficiently small, a signal of "L" state is outputted from the comparator 50.

After the signal of "L" state is outputted from the comparator 50, the switch 68 is opened by the control circuit section 72, and the switch 67 is closed instead. Thus, the capacitor 65 is charged by the first charge pump 66, so that the potential $V_c$ of the capacitor 65 rises (step 82 in FIG. 10). As a result, a signal of "H" state (i.e., steps $V_o$=1 [V]) is outputted from the comparator 50.

Thereafter, the switch 67 is opened again by the control circuit section 72, and the switch 68 is closed instead. Thus, the capacitor 65 is charged by the second charge pump 69, so that the potential $V_c$ of the capacitor 65 falls (step 83 in FIG. 10). As a result, a signal of "L" state is outputted from the comparator 50. If such operation is repeated, the signal of "H" state and the signal of "L" state will be alternately outputted from the 50 as shown in FIG. 10. In such state, the probability with which the comparator 50 outputs the signal of "H" state and the probability with which the comparator 50 outputs the signal of "L" state are substantially the same, so that the offset voltage is compensated.

In the comparator 50 of the present embodiment, the offset voltage is compensated in the aforesaid manner. Incidentally, as shown in FIG. 10, during the compensation operation, a period from the start of the operation until the signal of "H" state and the signal of "L" state are alternately outputted from the 50 is needed, and such period may be set to, for example, about 1 μsec.

Figure 11:
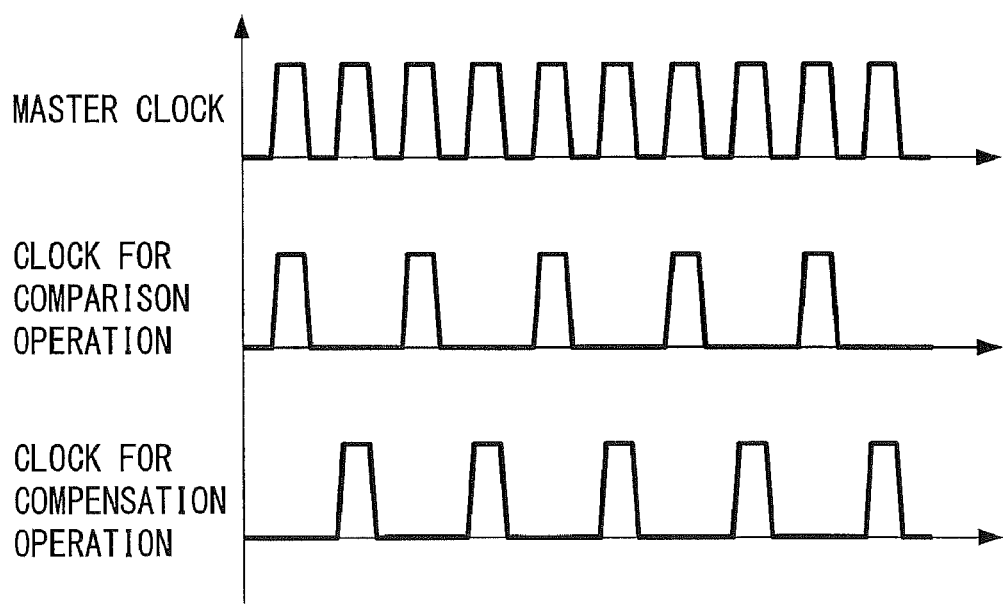
FIG. 11 is a graph explaining the relation between the timing of the compensation operation and the timing of comparison operation.

Incidentally, the compensation operation of the offset voltage of the comparator 50 is performed, for example, in the interval between the usual comparison operations. An example of such method is shown in FIG. 11. In the example shown in FIG. 11, a master clock (the upper waveform) of the comparator 50 is used to generate a clock signal (the middle waveform) for controlling the timing of the comparison operation and a clock signal (the lower waveform) for controlling the timing of the compensation operation. To be specific, the period of the two clock signals are set to be twice as long as the period of the master clock, and the phases of the two clock signals are displaced from each other so that the timings at which the clock signals become "H" state are not superimposed on each other. The compensation operation of the offset voltage and the usual comparison operation can be alternately performed by using the aforesaid clock signal for controlling the timing of the comparison operation and the aforesaid clock signal for controlling the timing of the compensation operation.

FIGS. 12A and 12B are graphs for comparing the offset voltage of the comparator 50 (which has the offset voltage compensating circuit section 60) of the present embodiment and the offset voltage of the comparator 400 (which has no offset voltage compensating circuit) of the prior art. FIG. 12A shows a result obtained by measuring the distribution of the offset voltage of each of 64 pieces of sequentially arranged comparators 50, in which the horizontal axis represents the number (sequence number) of the comparators, and the vertical axis represents the offset voltage $V_{offset}$ of each comparator. In FIG. 12A, the solid line represents the distribution of the offset voltages of the comparators 50 of the present embodiment, and the broken line represents the distribution of the offset voltages of the comparators 400 of the prior art. Further, FIG. 12B is a graph showing a statistical distribution of the offset voltages.

It is known from FIG. 12A that, in the comparator 50 of the present embodiment, the level of the offset voltage is sufficiently restrained compared to the prior art. Further, when obtaining a standard deviation based on the statistical distribution of the offset voltages shown in FIG. 12B, the standard deviation of the offset voltage of the comparator 400 of the prior art is $\Delta V_{offset}(\sigma)=13.7$ [mV], while the standard deviation of the present embodiment is $\Delta V_{offset}(\sigma)=1.69$ [mV]. In other words, in the comparator 50 of the present embodiment, the standard deviation of the offset voltage can be reduced to about ⅛ of that of the prior art.

Incidentally, although the present embodiment is described using an example in which the potential $V_c$ of the capacitor 65 (i.e., the gate voltage of the first compensation MOS transistor 61) is adjusted, the present invention is not limited to this example. For example, the present invention includes a configuration in which not only the potential $V_c$ of the capacitor 65, but also the voltage $V_b$ of the bias power supply 64 (i.e., the gate voltage of the second compensation MOS transistor 62) is adjusted to thereby relatively adjust the voltage difference between the potential $V_c$ of the capacitor 65 and the bias voltage $V_b$.

3. Third Embodiment

In a third embodiment, another configuration example of the comparator having the function of restraining the offset voltage will be described below.

[Configuration of Comparator]

FIG. 13 shows a circuit configuration of a comparator 80 according to the third embodiment of the present invention. The comparator 80 mainly includes a dynamic differential preamplifier circuit section 20 arranged on an input side (a first stage), a differential latch circuit section 30 arranged on an output side (a second stage), and an offset voltage compensating circuit section 90 arranged between the differential preamplifier circuit section 20 and the differential latch circuit section 30. Note that, in the description of the comparator 80 of the present embodiment shown in FIG. 13, like components are denoted by like reference numerals as of the comparator 10 of the first embodiment.

The differential preamplifier circuit section 20 and the differential latch circuit section 30 of the comparator 80 have the same configuration as those of the first embodiment. Thus, description of the differential preamplifier circuit section 20 and the differential latch circuit section 30 will be omitted here.

The offset voltage compensating circuit section 90 mainly includes two variable capacitance elements 91 and 92, a control circuit section (not shown in the drawing) for controlling the capacitance of the two variable capacitance elements 91 and 92, and a switching section (not shown in the drawing) for switching between a compensation operation of the offset voltage and the usual comparison operation of the comparator 80. Incidentally, the control circuit section and the switching section may have the same configuration as those of the second embodiment (see FIG. 9), for example.

One terminal of the variable capacitance element 91 is connected to the node N1 in the differential preamplifier circuit section 20, and the other terminal of the variable capacitance element 91 is grounded. Further, one terminal of the variable capacitance element 92 is connected to the node N2 in the differential preamplifier circuit section 20, and the other terminal of the variable capacitance element 92 is grounded. Incidentally, the adjustment of the capacitance of each variable capacitance element may be controlled by, for example, using a switching circuit in which a plurality of capacitance elements having different capacitance from each other are arranged, and at least one of the plurality of capacitance elements is selected when performing compensation operation.

[Compensation Operation of Offset Voltage]

Similar to the second embodiment, in the present embodiment, the capacitances of the two variable capacitance elements 91 and 92 are adjusted so that the voltage drop rate of the node N1 and the voltage drop rate of the node N2 are equal to each other in a state where the portion between the input terminals 26 and 27 is short-circuited.

The voltage drop rates of the nodes N1 and N2 may also be adjusted by adjusting the capacitance of capacitance elements connected to the nodes N1 and N2. For example, if the capacitance of capacitance elements connected to the nodes is increased, the voltage will become difficult to fall; while if the capacitance of capacitance elements connected to the nodes is decreased, the voltage will become easy to fall. In other words, the voltage drop rates of the nodes can be controlled by changing the capacitance of capacitance elements connected to the nodes.

Thus, similar to the second embodiment (see FIG. 10), in the offset voltage compensating circuit section 90 of the present embodiment, the offset voltage can also be compensated by adjusting the capacitances of the variable capacitance elements 91 and 92 relative to each other during the compensation operation.

Further, when the absolute value of the capacitances of the variable capacitance elements 91 and 92 of the offset voltage compensating circuit section 90 of the present embodiment is increased, even if there is noise added on the output line of the differential preamplifier circuit section 20, the noise can be absorbed due to the filter function of the variable capacitance elements 91 and 92, and therefore the sensitivity of the comparator 80 can be more improved. Thus, it is possible to provide an A/D converter with higher accuracy in such case.

4. Fourth Embodiment

In a parallel-type A/D converter such as the A/D converter described in the first embodiment, a plurality of comparators are arranged, wherein the number of the comparators is equal to the number of the reference voltages. In such a configuration, if the resolution of the A/D converter is N, the number of the reference voltages needs to be about $2^N$. For example, if the resolution N is 10 bits, the number of the reference voltages needs to be 1024, and therefore the same number (substantially 1000 pieces) of the comparators need to be employed. If a large number of comparators are connected to the input terminal of the A/D converter, the capacitance of the A/D converter when viewed from the input side will become large, and therefore the frequency characteristic of the A/D converter will be deteriorated.

To solve such problem, the number of the reference voltages needs to be reduced; however, if doing so, the resolution will be deteriorated. To reduce the number of the reference voltages while maintaining resolution, a method is used in which reference voltages between two reference voltages actually obtained by resistance-division or the like (i.e., reference voltages in a voltage interval of one-interpolation) are pseudo-generated by an interpolation technique, so that resolution is maintained.

Figure 14:
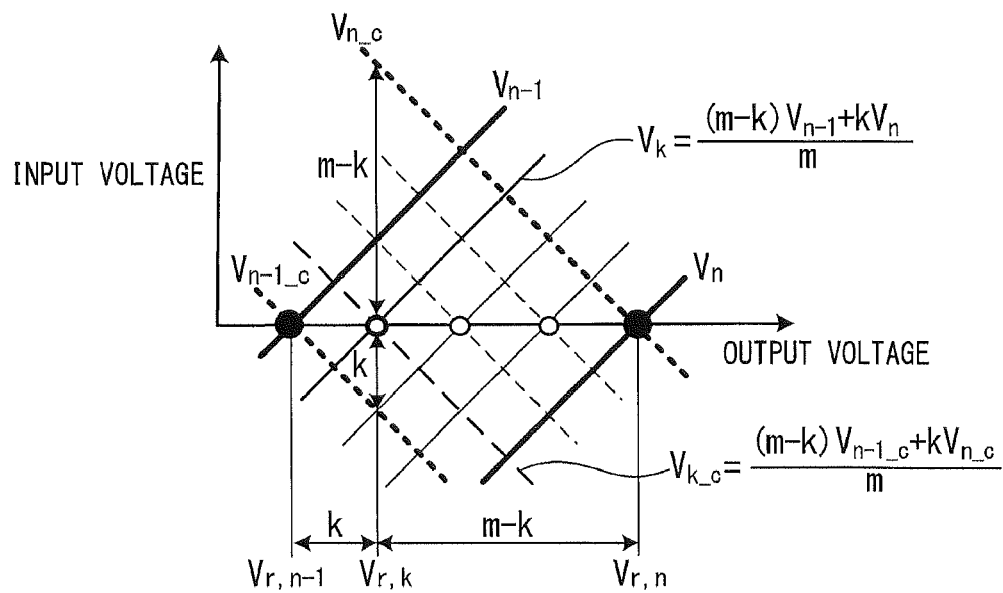
FIG. 14 is a graph schematically explaining interpolation principle used in a fourth embodiment of the present invention.

FIG. 14 shows the change of the voltage outputted from the differential preamplifier circuit section of the comparator in the time when two actually obtained reference voltages $V_{r,n-1}$, $V_{r,n}$ and the interpolation reference voltages between the two actually obtained reference voltages are compared with the input voltage to be compared. In FIG. 14, the horizontal axis represents the input voltage to the comparator, and the vertical axis represents the output voltage from the differential preamplifier circuit section. In FIG. 14, the characteristic indicated by the solid line shows the change of the voltage outputted from the normal side transistor of the differential preamplifier circuit section, and the characteristic indicated by the broken line shows the change of the voltage outputted from the inverted side transistor of the differential preamplifier circuit section.

Considered here is an output voltage when comparing an interpolated reference voltage $V_{r,k}$ with the input voltage using the comparator, wherein the interpolated reference voltage $V_{r,k}$ is obtained by dividing the portion between the reference voltage $V_{r,n-1}$ and the reference voltage $V_{r,n}$ (i.e., the voltage interval of one-interpolation) by k:m−k. In such a case, as shown in FIG. 14, voltage $V_k$ outputted from the normal side transistor of the differential preamplifier circuit section is: $V_k = \{(m-k)\cdot V_{n-1} + k\cdot V_n\}/m$. Further, voltage $V_{k\_c}$ outputted from the inverted side transistor of the differential preamplifier circuit section is: $V_{k\_c} = \{(m-k)\cdot V_{n-1\_c} + k\cdot V_{n\_c}\}/m$.

Incidentally, $V_{n-1}$ and $V_{n-1\_c}$ in the aforesaid equations respectively represent the voltage outputted from the normal side transistor and the voltage outputted from the inverted side transistor of the differential preamplifier circuit section when the reference voltage $V_{r,n-1}$ is compared with the input voltage by the comparator. Further, $V_n$ and $V_{n\_c}$ respectively represent the voltage outputted from the normal side transistor and the voltage outputted from the inverted side transistor of the differential preamplifier circuit section when the reference voltage $V_{r,n}$ is compared with the input voltage by the comparator.

In other words, when four signals of the voltages $V_n$, $V_{n\_c}$, $V_{n-1}$ and $V_{n-1\_c}$ are inputted to an interpolation-type comparator capable of comparing the interpolated reference voltage $V_{r,k}$ with the input voltage, the signals of the voltages $V_k$ and $V_{k\_c}$ expressed by the aforesaid equations are outputted from the differential preamplifier circuit section in the interpolation-type comparator. In the present embodiment, a configuration example of a comparator having such interpolation function and an A/D converter using the comparator will be described.

[Configuration of A/D Converter]

Figure 15:
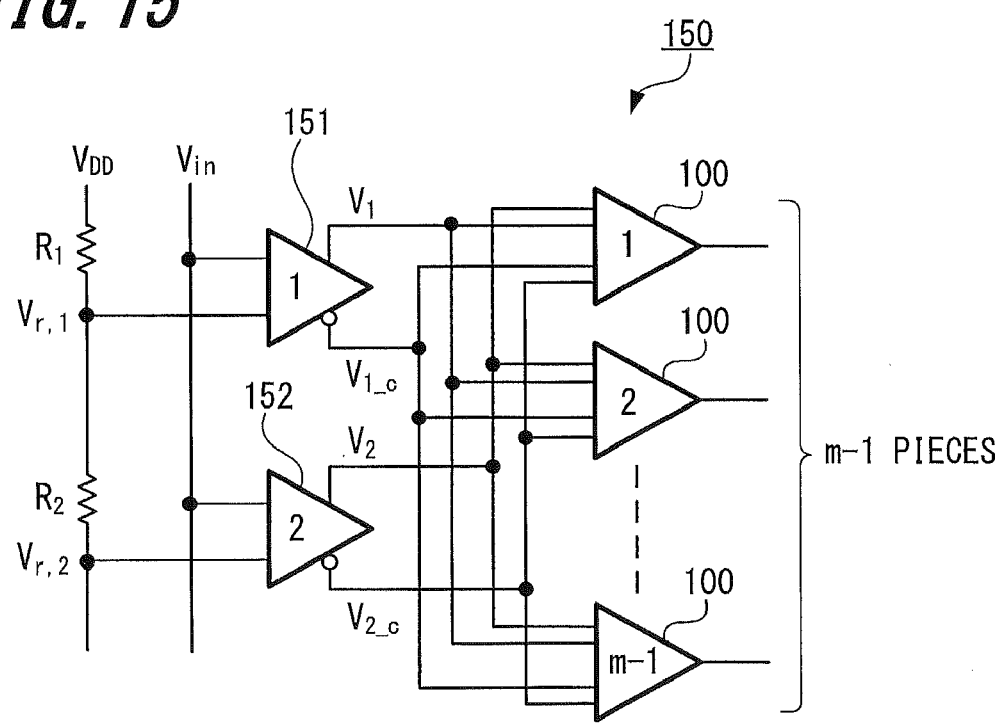
FIG. 15 is a diagram showing a schematic configuration of an A/D converter according to the fourth embodiment.

Before describing the configuration of a comparator of the present embodiment, a configuration example of the A/D converter having the aforesaid interpolation function will be described first. FIG. 15 shows a schematic configuration of an A/D converter 150 according to the present embodiment. Incidentally, FIG. 15 only shows a portion connected to the dividing resistors $R_1$ and $R_2$ for generating two reference voltages $V_{r,1}$ and $V_{r,2}$. In other words, FIG. 15 only shows a component associated with the voltage interval of one-interpolation. Further, considered in the present embodiment is a case where the portion between the two reference voltages $V_{r,1}$ and $V_{r,2}$ is equally divided into m pieces. Thus, m−1 pieces of comparators 100 having interpolation function need to be arranged in the voltage interval of one-interpolation.

In the A/D converter 150 according to the present embodiment, a plurality of differential amplifier (151, 152 . . . ) are arranged between the plurality of comparators 100 having interpolation function and the plurality of dividing resistors ($R_1$, $R_2$ . . . ). Further, in the present embodiment, since the portion between the two reference voltages $V_{r,1}$ and $V_{r,2}$ (i.e., the voltage interval of one-interpolation) is equally divided into m pieces, m−1 pieces of comparators 100 are connected in parallel to differential output terminals of two differential amplifiers 151 and 152.

Further, two output voltages $V_1$ and $V_{1\_c}$ of the differential amplifier 151 and two output voltages $V_2$ and $V_{2\_c}$ of the differential amplifier 152 are inputted to each comparator 100. At this time, the output voltages $V_1$ and $V_2$ are inputted to the MOS transistors on the normal side of the differential preamplifier circuit section, and the output voltages $V_{1\_c}$ and $V_{2\_c}$ are inputted to the MOS transistors on the inverted side of the differential preamplifier circuit section in the comparator 100. Incidentally, the output voltages $V_1$, $V_{1\_c}$, $V_2$ and $V_{2\_c}$ of the two differential amplifiers 151 and 152 correspond to, for example, $V_{n-1}$, $V_{n-1\_c}$, $V_n$ and $V_{n\_c}$ in FIG. 14.

With such a configuration, the reference voltages can be reduced. As a result, the capacitance of the A/D converter when viewed from the input side can be reduced, and therefore the frequency characteristic of the A/D converter can be prevented from being deteriorated. Further, the number of the resistors necessary for generating the reference voltages and the number of the peripheral circuits of the resistors can be reduced.

[Configuration of Comparator]

Figure 16:
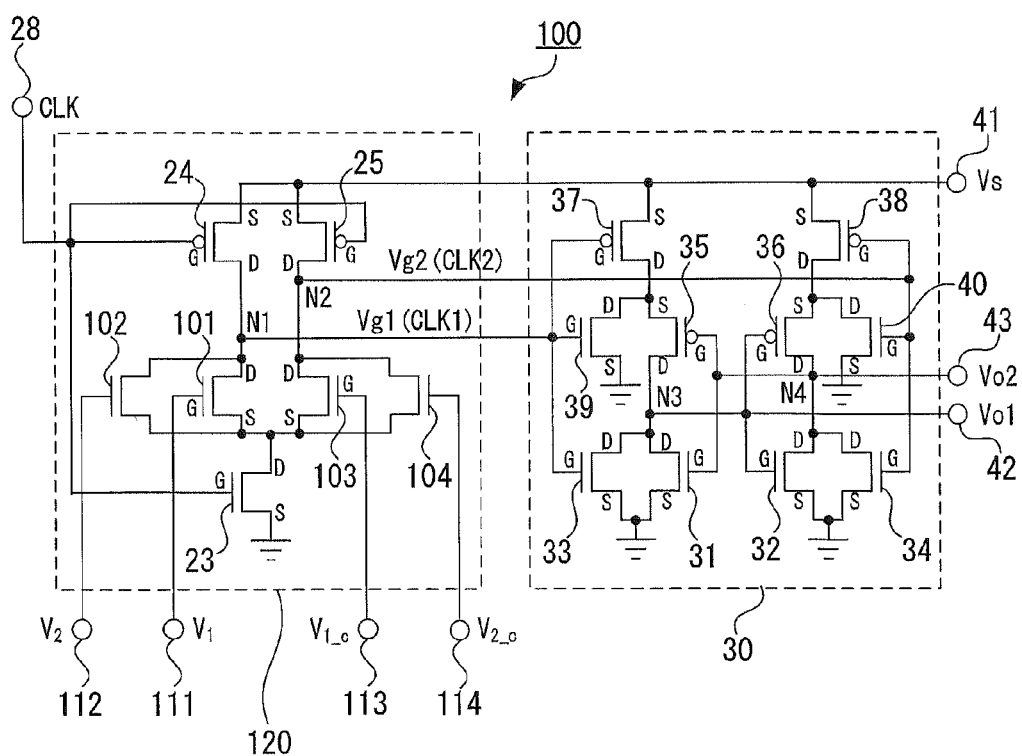
FIG. 16 is a diagram showing a schematic circuit configuration of a comparator according to the fourth embodiment.

FIG. 16 shows a circuit configuration of the comparator 100 according to the present embodiment. The comparator 100 mainly includes a dynamic differential preamplifier circuit section 120 arranged on an input side (a first stage), and a differential latch circuit section 30 arranged on an output side (a second stage). Note that, in the description of the comparator 100 of the present embodiment shown in FIG. 16, like components are denoted by like reference numerals as of the comparator 10 of the first embodiment.

The differential latch circuit section 30 of the comparator 100 of the present embodiment has the same configuration as that of the first embodiment. Thus, description of the differential latch circuit section 30 will be omitted here.

The differential preamplifier circuit section 120 (differential amplifier circuit section) includes five NMOS transistors 101, 102, 103, 104 and 23, and two PMOS transistors 24 and 25. In the present embodiment, the normal side transistors of an input differential transistor pair in the differential preamplifier circuit section 120 are configured by two NMOS transistors 101 and 102. Further, the inverted side transistors are configured by two NMOS transistors 103 and 104. Other aspects of the configuration are identical as those of the first embodiment.

The gate terminal of an NMOS transistor 101 (the first MOS transistor) on the normal side is connected to an input terminal 111 to which a signal of the output voltage $V_1$ from the normal side of the differential amplifier 151 (a first input voltage signal) is inputted. In other words, the output voltage $V_1$ from the normal side of the differential amplifier 151 becomes the gate voltage of the NMOS transistor 101. The drain terminal (input side terminal) of the NMOS transistor 101 is connected to the drain terminal (output side terminal) of the fourth MOS transistor 24. Further, the source terminal (output side terminal) of the NMOS transistor 101 is connected to the drain terminal (input side terminal) of the third MOS transistor 23.

The gate terminal of an NMOS transistor 102 (a sixteenth MOS transistor) on the normal side is connected to an input terminal 112 to which a signal of the output voltage $V_2$ from the normal side of the differential amplifier 152 (a third input voltage signal) is inputted. In other words, the output voltage $V_2$ from the normal side of the differential amplifier 152 becomes the gate voltage of the NMOS transistor 102. Further, the drain terminal (input side terminal) of the NMOS transistor 102 is connected to the drain terminal (input side terminal) of the NMOS transistor 101. Further, the source terminal (output side terminal) of the NMOS transistor 102 is connected to the source terminal (output side terminal) of the NMOS transistor 101.

Further, the gate terminal of an NMOS transistor 103 (the second MOS transistor) on the inverted side is connected to an input terminal 113 to which a signal of the output voltage $V_{1\_c}$ from the inverted side of the differential amplifier 151 (a second input voltage signal) is inputted. In other words, the output voltage $V_{1\_c}$ from the inverted side of the differential amplifier 151 becomes the gate voltage of the NMOS transistor 103. Further, the drain terminal (input side terminal) of the NMOS transistor 103 is connected to the drain terminal (output side terminal) of the fifth MOS transistor 25. Further, the source terminal (output side terminal) of the NMOS transistor 102 is connected to the drain terminal (input side terminal) of the third MOS transistor 23.

The gate terminal of an NMOS transistor 104 (the second MOS transistor) on the inverted side is connected to an input terminal 114 to which a signal of the output voltage $V_{2\_c}$ from the inverted side of the differential amplifier 152 (a fourth input voltage signal) is inputted. In other words, the output voltage $V_{2\_c}$ from the inverted side of the differential amplifier 152 becomes the gate voltage of the NMOS transistor 104. Further, the drain terminal (input side terminal) of the NMOS transistor 104 is connected to the drain terminal (input side terminal) of the NMOS transistor 103. Further, the source terminal (output side terminal) of the NMOS transistor 104 is connected to the source terminal (output side terminal) of the NMOS transistor 103.

In the comparator 100 of the present embodiment, it is possible to compare the input voltage with a predetermined interpolated reference voltage by changing the ratio of channel-width (i.e., the width of the transistor) to channel-length (i.e., the length of the transistor) of each of the NMOS transistors 101 to 104, which configure the input differential transistor pair in the differential preamplifier circuit section 120. The ratio of channel-width to channel-length will be referred to as "ratio of W/L" hereinafter.

[Operation Principle of Comparator]

Next, the operation principle of the comparator 100 of the present embodiment will be described below. Here, a case is considered in which the ratio of W/L is changed by changing the channel-width W of each of the NMOS transistors 101 to 104, which configure the input differential transistor pair. Further, all of the NMOS transistors 101 to 104 have the same channel-length L, carrier's moving amount μ, unit gate capacitance $C_{ox}$, threshold voltage $V_T$.

The currents $I_{ds\_101}$, $I_{ds\_102}$, $I_{ds\_103}$ and $I_{ds\_104}$ flowing through the NMOS transistors 101 to 104 are expressed by the following equation 1. $W_{101}$ to $W_{104}$ of the following equation 1 represent the channel-width of the NMOS transistors 101 to 104.

$$I_{ds\_101} = \frac{1}{2}\mu C_{ox}\frac{W_{101}}{L}(V_1 - V_T) \qquad \text{[Equation 1]}$$

$$I_{ds\_112} = \frac{1}{2}\mu C_{ox}\frac{W_{102}}{L}(V_2 - V_T)$$

$$I_{ds\_103} = \frac{1}{2}\mu C_{ox}\frac{W_{103}}{L}(V_{1\_c} - V_T)$$

$$I_{ds\_104} = \frac{1}{2}\mu C_{ox}\frac{W_{104}}{L}(V_{2\_c} - V_T)$$

In the comparison operation of the comparator 100, the sum current of the currents flowing through the two NMOS transistors 101 and 102 on the normal side of the differential preamplifier circuit section 120 and the sum current of the currents flowing through the two NMOS transistors 103 and 104 on the inverted side of the differential preamplifier circuit section 120 are compared with each other. The sum currents are expressed by the following equation.

$$I_{ds\_101} + I_{ds\_102} = \frac{1}{2}\mu C_{ox}\frac{1}{L}\{W_{101}(V_1 - V_T) + W_{102}(V_2 - V_T)\} \qquad \text{[Equation 2]}$$

$$I_{ds\_103} + I_{ds\_104} =$$

$$\frac{1}{2}\mu C_{ox}\frac{1}{L}\{W_{103}(V_{1\_c} - V_T) + W_{104}(V_{2\_c} - V_T)\}$$

Here, $W_{101}=W_{103}=W1$, $W_{102}=W_{104}=W2$, $W1:W2=(m-k):k$, and the boundary condition where the two sum currents expressed by equation 2 are equal to each other can be obtained by the following equation 3.

$$W_1(V_1 - V_T) + W_2(V_2 - V_T) = \qquad \text{[Equation 3]}$$
$$W_1(V_{1\_c} - V_T) + W_2(V_{2\_c} - V_T)$$
$$\therefore W_1(V_1 - V_{1\_c}) = W_2(V_{2\_c} - V_2)$$
$$\therefore \frac{m-k}{m}(V_1 - V_{1\_c}) = \frac{k}{m}(V_{2\_c} - V_2)$$

The above equation 3 can be rewritten into the following equation 4.

$$\frac{(m-k)V_1 + kV_2}{m} = \frac{(m-k)V_{1\_c} + kV_{2\_c}}{m} \qquad \text{[Equation 4]}$$

As can be known by comparing the expressions of the two sides of equation 4 with the output voltage $V_k$ of the normal side and the output voltage $V_{k\_c}$ of the inverted side outputted from the differential preamplifier circuit section with respect to the interpolated reference voltage $V_{r,k}$ discussed with reference to FIG. 14, the left side of equation 4 represents the output voltage of the normal side of the differential preamplifier circuit section 120, and the right side of equation 4 represents the output voltage of the inverted side of the differential preamplifier circuit section 120.

In other words, in the comparator 100 of the present embodiment, when four signals of the voltages $V_1$, $V_{1\_c}$, $V_2$ and $V_{2\_c}$ are inputted to the comparator 100, the voltage expressed as the left side of equation 4 is outputted from the normal side of the transistor pair of the differential preamplifier circuit section 120, and the voltage expressed as the right side of equation 4 is outputted from the inverted side of the transistor pair of the differential preamplifier circuit section 120. This means that, in the comparator 100, comparison operation is pseudo-performed by the interpolated reference voltage obtained by dividing the portion between the reference voltage $V_{r,1}$ and the reference voltage $V_{r,2}$, as shown in FIG. 15, by (m−k):k. Thus, in the comparator 100 of the present embodiment, comparison operation with the predetermined interpolated reference voltage $V_{r,k}$ can be performed by setting the ratio of the channel-width W1 of the NMOS transistors 101 and 103 to the channel-width W2 of the NMOS transistors 102 and 104 to: W1:W2=(m−k):k. For example, if W1:W2=1:1, comparison operation can be performed with an interpolated reference voltage at the middle point between the reference voltage $V_{r,1}$ and the reference voltage $V_{r,2}$.

In the present embodiment, based on the aforesaid interpolation principle, the ratio of W/L of the NMOS transistors 101 to 104 of the differential preamplifier circuit section is adjusted so that each comparator 100 can perform comparison operation with a predetermined interpolated reference voltage.

Incidentally, in the A/D converter 150 shown in FIG. 15, the ratio of the channel-width W1 of the NMOS transistors 101 and 103 to the channel-width W2 of the NMOS transistors 102 and 104 of the differential preamplifier circuit section 120 are set differently for each of the (m−1) pieces of comparators 100 connected to the differential output terminals of the two differential amplifiers 151 and 152. Incidentally, the above description is made using an example in which the ratio of W/L is changed by changing the channel-width W of each transistor, however the present invention is not limited this example. The ratio of W/L may also be changed by changing the channel-length L of each transistor, or be changed by changing both the channel-width W and the channel-length L of each transistor.

However, when adjusting the ratio of W/L of the NMOS transistors, it is preferred that the channel-width W is adjusted for the sake of ease of adjustment. As an adjustment method, the channel-width W may simply be increased, or a plurality of MOS transistors, each having a smallest pattern of the channel-width W, may be formed on an LSI chip, and connected to each other in parallel. An example of such configuration is shown in FIG. 17.

Figure 17:
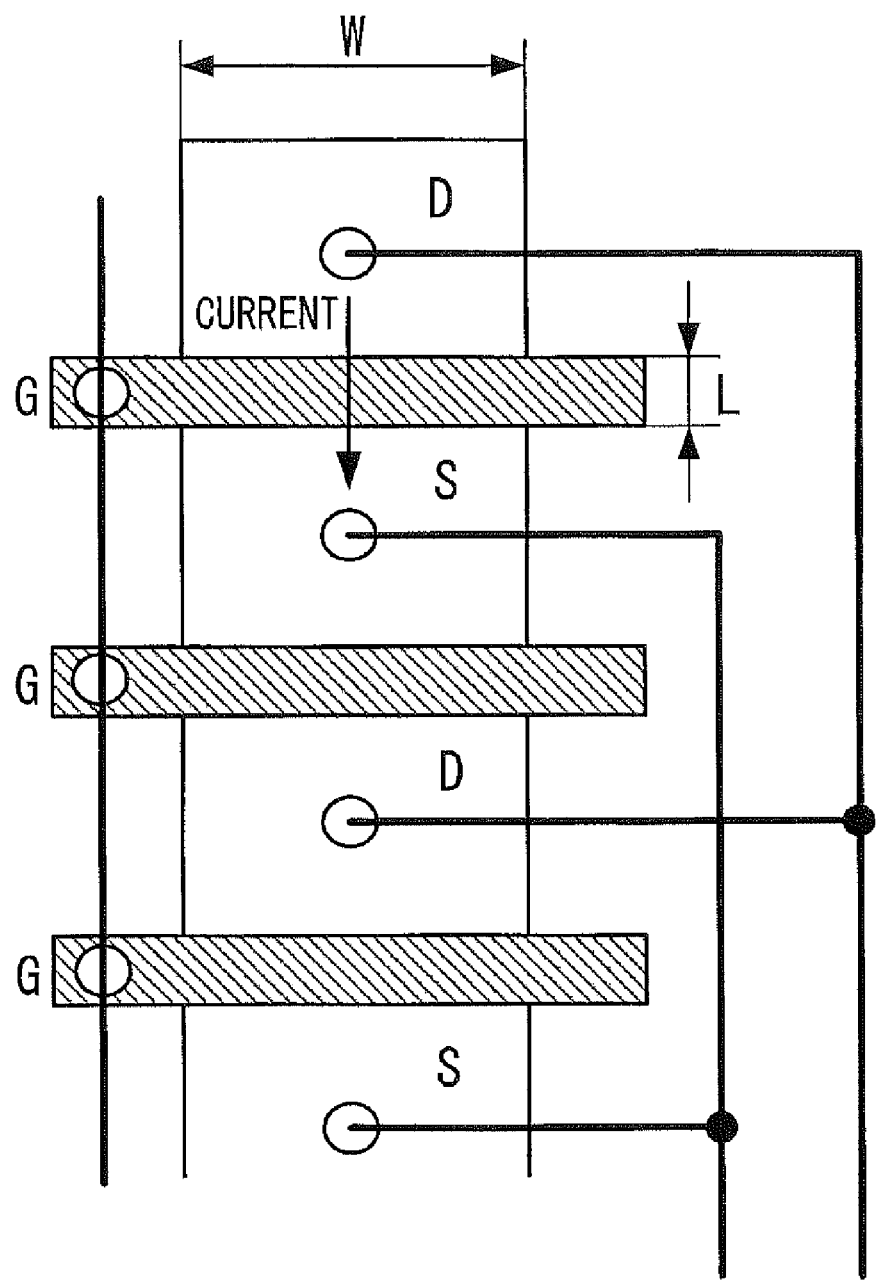
FIG. 17 is a top view schematically showing an NMOS transistor used in the comparator according to the fourth embodiment.

FIG. 17 is a top view schematically showing such NMOS transistors. In the example shown in FIG. 17, a plurality of drain regions (D) and source regions (S) of the channel-width W are alternately formed along the direction of current flow, and a gate region (G) is formed between each drain region (D) and source region (S). In such a manner, a plurality of MOS transistors, each having a smallest pattern of the channel-width W, are formed. Further, the drain regions are mutually connected, the source regions and the gate regions are connected to each other respectively, so that the plurality of MOS transistors, each having a smallest pattern of the channel-width W, are connected to each other in parallel. As a result, the channel-width W of the NMOS transistors in its entirety is increased equivalently. In the case where such method is used to adjust the channel-width W, denseness may also be improved by making the layout of the pattern more compact.

EXPLANATION OF REFERENCE NUMERALS 10, 10a to 10h, 50, 80, 100 comparator
11a to 11g NAND circuit
12 encoder
13, 150 A/D converter
20, 120 differential preamplifier circuit section (differential amplifier circuit section)
21, 101 first MOS transistor
22, 103 second MOS transistor
23 third MOS transistor
24 fourth MOS transistor
25 fifth MOS transistor
26, 27 input terminal
28 clock terminal
30 differential latch circuit section
31 sixth MOS transistor
32 seventh MOS transistor
33 eighth MOS transistor
34 ninth MOS transistor
35 tenth MOS transistor
36 eleventh MOS transistor
37 twelfth MOS transistor
38 thirteenth MOS transistor
39 fourteenth MOS transistor
40 fifteenth MOS transistor
42, 43 output terminal
60, 90 offset voltage compensating circuit section
61 first compensation MOS transistor
62 second compensation MOS transistor
63 voltage adjusting section
72 control circuit section
78 switching section
91, 92 variable capacitance element
102 sixteenth NMOS transistor
104 seventeenth NMOS transistor
151, 152 differential amplifier

The invention claimed is:

1. A comparator comprising:
   a dynamic differential amplifier circuit section, to which a first input voltage signal, a second input voltage signal and a clock signal are inputted, adapted to operate, based on the clock signal, to output a first output voltage signal and a second output voltage signal and further, when the clock signal is in a first state, to cut off through-current and pre-charge the voltage values of the first and second output voltage signals to a predetermined voltage value; and, when the clock signal is in a second state, to change the voltage values of the first and second output voltage signals in the same direction at the same timing and generate a voltage difference between the voltage value of the first output voltage signal and the voltage value of the second output voltage signal without causing through-current to flow, wherein the first output voltage signal and the second output voltage signal respectively correspond to the value of the first input voltage signal and the value of the second input voltage signal and are amplified; and
   a differential latch circuit section adapted to operate, based on the first output voltage signal and the second output voltage signal, to keep and output a comparison result between the first input voltage signal and the second input voltage signal, without requiring a clock signal.

2. The comparator according to claim 1,
   wherein the dynamic differential amplifier circuit section includes a first MOS transistor, a second MOS transistor, a third MOS transistor, a fourth MOS transistor, and a fifth MOS transistor, where the first to third MOS transistors are each a MOS transistor whose channel polarity is a first polarity, and the fourth to fifth MOS transistors are each a MOS transistor whose channel polarity is a second polarity different from the first polarity, wherein a gate terminal of the first MOS transistor is connected to an input terminal of the first input voltage signal, wherein a gate terminal of the second MOS transistor is connected to an input terminal of the second input voltage signal, wherein a gate terminal of the third MOS transistor is connected to an input terminal of the clock signal, an input side terminal of the third MOS transistor is connected to an output side terminal of the second MOS transistor, and an output side terminal of the third MOS transistor is grounded, wherein a gate terminal of the fourth MOS transistor is connected to the input terminal of the clock signal, an input side terminal of the fourth MOS transistor is connected to an input terminal of a power supply voltage, and an output side terminal of the fourth MOS transistor is connected to an input side terminal of the first MOS transistor, wherein a gate terminal of the fifth MOS transistor is connected to the input terminal of the clock signal, an input side terminal of the fifth MOS transistor is connected to the input terminal of the power supply voltage, and an output side terminal of the fifth MOS transistor is connected to an input side terminal of the second MOS transistor, and wherein the first output voltage signal is outputted from a first connecting point between the input side terminal of the first MOS transistor and the output side terminal of the fourth MOS transistor, and the second output voltage signal is outputted from a second connecting point between the input side terminal of the second MOS transistor and the output side terminal of the fifth MOS transistor.

3. The comparator according to claim 1,
wherein the differential latch circuit section includes a sixth MOS transistor, a seventh MOS transistor, an eighth MOS transistor, a ninth MOS transistor, a tenth MOS transistor, an eleventh MOS transistor, a twelfth MOS transistor and a thirteenth MOS transistor, wherein the sixth to ninth MOS transistors are each a MOS transistor whose channel polarity is the first polarity, and the tenth to thirteenth MOS transistors are each a MOS transistor whose channel polarity is the second polarity different from the first polarity, wherein a gate terminal of the sixth MOS transistor is connected to a gate terminal of the tenth MOS transistor, an input side terminal of the sixth MOS transistor is connected to an output side terminal of the tenth MOS transistor, and an output side terminal of the sixth MOS transistor is grounded, wherein a gate terminal of the seventh MOS transistor is connected to a gate terminal of the eleventh MOS transistor, an input side terminal of the seventh MOS transistor is connected to an output side terminal of the eleventh MOS transistor, and an output side terminal of the seventh MOS transistor is grounded, wherein a third connecting point between the input side terminal of the sixth MOS transistor and the output side terminal of the tenth MOS transistor and a fourth connecting point between the input side terminal of the seventh MOS transistor and the output side terminal of the eleventh MOS transistor are respectively connected to a fifth connecting point between the gate terminal of the seventh MOS transistor and the gate terminal of the eleventh MOS transistor and a sixth connecting point between the gate terminal of the sixth MOS transistor and the gate terminal of the tenth MOS transistor, wherein a gate terminal of the eighth MOS transistor is connected to an output terminal of the first output voltage signal in the dynamic differential amplifier circuit section, an input side terminal of the eighth MOS transistor is connected to the input side terminal of the sixth MOS transistor, and an output side terminal of the eighth MOS transistor is grounded, wherein a gate terminal of the ninth MOS transistor is connected to an output terminal of the second output voltage signal in the dynamic differential amplifier circuit section, an input side terminal of the ninth MOS transistor is connected to the input side terminal of the seventh MOS transistor, and an output side terminal of the ninth MOS transistor is grounded, wherein a gate terminal of the twelfth MOS transistor is connected to the output terminal of the first output voltage signal in the dynamic differential amplifier circuit section, an input side terminal of the twelfth MOS transistor is connected to the input terminal of the power supply voltage, and an output side terminal of the twelfth MOS transistor is connected to an input side terminal of the tenth MOS transistor, wherein a gate terminal of the thirteenth MOS transistor is connected to the output terminal of the second output voltage signal in the dynamic differential amplifier circuit section, an input side terminal of the thirteenth MOS transistor is connected to the input terminal of the power supply voltage, and an output side terminal of the thirteenth MOS transistor is connected to an input side terminal of the eleventh MOS transistor, and wherein the comparison result is outputted from the third and fourth connecting points.

4. The comparator according to claim 3,
wherein the differential latch circuit section further includes a fourteenth MOS transistor and a fifteenth MOS transistor which are each a MOS transistor whose channel polarity is the first polarity, wherein a gate terminal of the fourteenth MOS transistor is connected to the output terminal of the first output voltage signal in the dynamic differential amplifier circuit section, an input side terminal of the fourteenth MOS transistor is connected to the input side terminal of the tenth MOS transistor, and an output side terminal of the fourteenth MOS transistor is grounded, and wherein a gate terminal of the fifteenth MOS transistor is connected to the output terminal of the second output voltage signal in the dynamic differential amplifier circuit section, an input side terminal of the fifteenth MOS transistor is connected to the input side terminal of the eleventh MOS transistor, and an output side terminal of the fifteenth MOS transistor is grounded.

5. The comparator according to claim 2, further comprising an offset voltage compensating circuit adapted to compensate an offset voltage,
wherein the offset voltage compensating circuit includes:
a first compensation MOS transistor whose input side terminal and output side terminal are respectively connected to the input side terminal and an output side terminal of the first MOS transistor;

a second compensation MOS transistor whose input side terminal and output side terminal are respectively connected to the input side terminal and the output side terminal of the second MOS transistor;

a voltage adjusting section connected to the gate terminals of the first and second compensation MOS transistors and adapted to adjust the gate voltages;

a control circuit section adapted to control the adjustment operation of adjusting the gate voltages of the first and second compensation MOS transistors performed by the voltage adjusting section; and a switching section adapted to switch between the operation of comparing the first input voltage signal with the second input voltage signal and the operation of compensating the offset voltage.

6. The comparator according to claim 2, further comprising an offset voltage compensating circuit adapted to compensate an offset voltage, wherein the offset voltage compensating circuit includes:
a first variable capacitance element connected to the output terminal of the first output voltage signal in the dynamic differential amplifier circuit section;

a second variable capacitance element connected to the output terminal of the second output voltage signal in the dynamic differential amplifier circuit section;

a control circuit section adapted to control capacitance adjustment of the first and second variable capacitance elements; and a switching section adapted to switch between the operation of comparing the first input voltage signal with the second input voltage signal and the operation of compensating the offset voltage.

7. The comparator according to claim 2, wherein the dynamic differential amplifier circuit section further includes a sixteenth MOS transistor and a seventeenth MOS transistor which are each a MOS transistor whose channel polarity is the first polarity, wherein an input side terminal and an output side terminal of the sixteenth MOS transistor are respectively connected to the input side terminal and the output side terminal of the first MOS transistor, and a gate terminal of the sixteenth MOS transistor is connected to an input terminal of a third input voltage signal, wherein an input side terminal and an output side terminal of the seventeenth MOS transistor are respectively connected to the input side terminal and the output side terminal of the second MOS transistor, and a gate terminal of the seventeenth MOS transistor is connected to an input terminal of a fourth input voltage signal, and wherein a ratio W/L of channel-width W to channel-length L of each of the first, second, sixteenth and seventeenth MOS transistors is adjusted so that comparison operation can be performed with a predetermined interpolation voltage.

8. An A/D converter comprising:
a plurality of comparators, to which an input voltage signal, a reference voltage signal to be compared with the input voltage signal, and a clock signal are inputted, adapted to output a comparison result between the input voltage signal and the reference voltage signal; and an encoder adapted to output a digital signal corresponding to the input voltage signal based on the comparison result outputted from the plurality of comparators, wherein the comparators comprises:
a dynamic differential amplifier circuit section adapted to operate, based on the clock signal, to output a first output voltage signal and a second output voltage signal and further, when the clock signal is in a first state, to cut off through-current and pre-charge the voltage values of the first and second output voltage signals to a predetermined voltage value; and, when the clock signal is in a second state, to change the voltage values of the first and second output voltage signals in the same direction at the same timing and generate a voltage difference between the voltage value of the first output voltage signal and the voltage value of the second output voltage signal without causing through-current to flow, wherein the first output voltage signal and the second output voltage signal respectively correspond to the value of the input voltage signal and the value of the reference voltage signal and are amplified, and a differential latch circuit section adapted to operate, based on the first output voltage signal and the second output voltage signal, to keep and output the comparison result between the input voltage signal and the reference voltage signal, without requiring a clock signal.

9. The comparator according to claim 2, wherein the differential latch circuit section includes a sixth MOS transistor, a seventh MOS transistor, an eighth MOS transistor, a ninth MOS transistor, a tenth MOS transistor, an eleventh MOS transistor, a twelfth MOS transistor and a thirteenth MOS transistor, wherein the sixth to ninth MOS transistors are each a MOS transistor whose channel polarity is the first polarity, and the tenth to thirteenth MOS transistors are each a MOS transistor whose channel polarity is the second polarity different from the first polarity, wherein a gate terminal of the sixth MOS transistor is connected to a gate terminal of the tenth MOS transistor, an input side terminal of the sixth MOS transistor is connected to an output side terminal of the tenth MOS transistor, and an output side terminal of the sixth MOS transistor is grounded, wherein a gate terminal of the seventh MOS transistor is connected to a gate terminal of the eleventh MOS transistor, an input side terminal of the seventh MOS transistor is connected to an output side terminal of the eleventh MOS transistor, and an output side terminal of the seventh MOS transistor is grounded, wherein a third connecting point between the input side terminal of the sixth MOS transistor and the output side terminal of the tenth MOS transistor and a fourth connecting point between the input side terminal of the seventh MOS transistor and the output side terminal of the eleventh MOS transistor are respectively connected to a fifth connecting point between the gate terminal of the seventh MOS transistor and the gate terminal of the eleventh MOS transistor and a sixth connecting point between the gate terminal of the sixth MOS transistor and the gate terminal of the tenth MOS transistor, wherein a gate terminal of the eighth MOS transistor is connected to an output terminal of the first output voltage signal in the dynamic differential amplifier circuit section, an input side terminal of the eighth MOS transistor is connected to the input side terminal of the sixth MOS transistor, and an output side terminal of the eighth MOS transistor is grounded, wherein a gate terminal of the ninth MOS transistor is connected to an output terminal of the second output voltage signal in the dynamic differential amplifier circuit section, an input side terminal of the ninth MOS transistor is connected to the input side terminal of the seventh MOS transistor, and an output side terminal of the ninth MOS transistor is grounded, wherein a gate terminal of the twelfth MOS transistor is connected to the output terminal of the first output voltage signal in the dynamic differential amplifier circuit section, an input side terminal of the twelfth MOS transistor is connected to the input terminal of the power supply voltage, and an output side terminal of the twelfth MOS transistor is connected to an input side terminal of the tenth MOS transistor, wherein a gate terminal of the thirteenth MOS transistor is connected to the output terminal of the second output voltage signal in the dynamic differential amplifier circuit section, an input side terminal of the thirteenth MOS transistor is connected to the input terminal of the power supply voltage, and an output side terminal of the thirteenth MOS transistor is connected to an input side terminal of the eleventh MOS transistor, and wherein the comparison result is outputted from the third and fourth connecting points.

10. The comparator according to claim 3, further comprising an offset voltage compensating circuit adapted to compensate an offset voltage, wherein the offset voltage compensating circuit includes:
a first compensation MOS transistor whose input side terminal and output side terminal are respectively connected to the input side terminal and an output side terminal of the first MOS transistor;
a second compensation MOS transistor whose input side terminal and output side terminal are respectively connected to the input side terminal and the output side terminal of the second MOS transistor;
a voltage adjusting section connected to the gate terminals of the first and second compensation MOS transistors and adapted to adjust the gate voltages;
a control circuit section adapted to control the adjustment operation of adjusting the gate voltages of the first and second compensation MOS transistors performed by the voltage adjusting section; and
a switching section adapted to switch between the operation of comparing the first input voltage signal with the second input voltage signal and the operation of compensating the offset voltage.

11. The comparator according to claim 4, further comprising an offset voltage compensating circuit adapted to compensate an offset voltage, wherein the offset voltage compensating circuit includes:
a first compensation MOS transistor whose input side terminal and output side terminal are respectively connected to the input side terminal and an output side terminal of the first MOS transistor;
a second compensation MOS transistor whose input side terminal and output side terminal are respectively connected to the input side terminal and the output side terminal of the second MOS transistor;
a voltage adjusting section connected to the gate terminals of the first and second compensation MOS transistors and adapted to adjust the gate voltages;
a control circuit section adapted to control the adjustment operation of adjusting the gate voltages of the first and second compensation MOS transistors performed by the voltage adjusting section; and
a switching section adapted to switch between the operation of comparing the first input voltage signal with the second input voltage signal and the operation of compensating the offset voltage.

12. The comparator according to claim 3, further comprising an offset voltage compensating circuit adapted to compensate an offset voltage, wherein the offset voltage compensating circuit includes:
a first variable capacitance element connected to the output terminal of the first output voltage signal in the dynamic differential amplifier circuit section;
a second variable capacitance element connected to the output terminal of the second output voltage signal in the dynamic differential amplifier circuit section;
a control circuit section adapted to control capacitance adjustment of the first and second variable capacitance elements; and
a switching section adapted to switch between the operation of comparing the first input voltage signal with the second input voltage signal and the operation of compensating the offset voltage.

13. The comparator according to claim 4, further comprising an offset voltage compensating circuit adapted to compensate an offset voltage, wherein the offset voltage compensating circuit includes:
a first variable capacitance element connected to the output terminal of the first output voltage signal in the dynamic differential amplifier circuit section;
a second variable capacitance element connected to the output terminal of the second output voltage signal in the dynamic differential amplifier circuit section;
a control circuit section adapted to control capacitance adjustment of the first and second variable capacitance elements; and
a switching section adapted to switch between the operation of comparing the first input voltage signal with the second input voltage signal and the operation of compensating the offset voltage.

14. The comparator according to claim 3, wherein the dynamic differential amplifier circuit section further includes a sixteenth MOS transistor and a seventeenth MOS transistor which are each a MOS transistor whose channel polarity is the first polarity, wherein an input side terminal and an output side terminal of the sixteenth MOS transistor are respectively connected to the input side terminal and the output side terminal of the first MOS transistor, and a gate terminal of the sixteenth MOS transistor is connected to an input terminal of a third input voltage signal, wherein an input side terminal and an output side terminal of the seventeenth MOS transistor are respectively connected to the input side terminal and the output side terminal of the second MOS transistor, and a gate terminal of the seventeenth MOS transistor is connected to an input terminal of a fourth input voltage signal, and wherein a ratio W/L of channel-width W to channel-length L of each of the first, second, sixth and seventeenth MOS transistors is adjusted so that comparison operation can be performed with a predetermined interpolation voltage.

15. The comparator according to claim 4, wherein the dynamic differential amplifier circuit section further includes a sixteenth MOS transistor and a seventeenth MOS transistor which are each a MOS transistor whose channel polarity is the first polarity, wherein an input side terminal and an output side terminal of the sixteenth MOS transistor are respectively connected to the input side terminal and the output side terminal of the first MOS transistor, and a gate terminal of the sixteenth MOS transistor is connected to an input terminal of a third input voltage signal, wherein an input side terminal and an output side terminal of the seventeenth MOS transistor are respectively connected to the input side terminal and the output side terminal of the second MOS transistor, and a gate terminal of the seventeenth MOS transistor is connected to an input terminal of a fourth input voltage signal, and wherein a ratio W/L of channel-width W to channel-length L of each of the first, second, sixth and seventeenth MOS transistors is adjusted so that comparison operation can be performed with a predetermined interpolation voltage.

16. The comparator according to claim 5, wherein the dynamic differential amplifier circuit section further includes a sixteenth MOS transistor and a seventeenth MOS transistor which are each a MOS transistor whose channel polarity is the first polarity, wherein an input side terminal and an output side terminal of the sixteenth MOS transistor are respectively connected to the input side terminal and the output side terminal of the first MOS transistor, and a gate terminal of the sixteenth MOS transistor is connected to an input terminal of a third input voltage signal, wherein an input side terminal and an output side terminal of the seventeenth MOS transistor are respectively connected to the input side terminal and the output side terminal of the second MOS transistor, and a gate terminal of the seventeenth MOS transistor is connected to an input terminal of a fourth input voltage signal, and wherein a ratio W/L of channel-width W to channel-length L of each of the first, second, sixth and seventeenth MOS transistors is adjusted so that comparison operation can be performed with a predetermined interpolation voltage.

17. The comparator according to claim 6, wherein the dynamic differential amplifier circuit section further includes a sixteenth MOS transistor and a seventeenth MOS transistor which are each a MOS transistor whose channel polarity is the first polarity, wherein an input side terminal and an output side terminal of the sixteenth MOS transistor are respectively connected to the input side terminal and the output side terminal of the first MOS transistor, and a gate terminal of the sixteenth MOS transistor is connected to an input terminal of a third input voltage signal, wherein an input side terminal and an output side terminal of the seventeenth MOS transistor are respectively connected to the input side terminal and the output side terminal of the second MOS transistor, and a gate terminal of the seventeenth MOS transistor is connected to an input terminal of a fourth input voltage signal, and wherein a ratio W/L of channel-width W to channel-length L of each of the first, second, sixth and seventeenth MOS transistors is adjusted so that comparison operation can be performed with a predetermined interpolation voltage.

* * * * *